(12) United States Patent
Lee et al.

(10) Patent No.: US 10,033,844 B2
(45) Date of Patent: Jul. 24, 2018

(54) PROXIMITY ILLUMINANCE SENSOR MODULE AND MOBILE TERMINAL USING SAME

(71) Applicant: LG ELECTRONICS INC., Seoul (KR)

(72) Inventors: Byunghwa Lee, Seoul (KR); Hyunsu Song, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/322,379

(22) PCT Filed: Jan. 15, 2015

(86) PCT No.: PCT/KR2015/000423
§ 371 (c)(1),
(2) Date: Dec. 27, 2016

(87) PCT Pub. No.: WO2016/003036
PCT Pub. Date: Jan. 7, 2016

(65) Prior Publication Data
US 2017/0134545 A1 May 11, 2017

(30) Foreign Application Priority Data
Jul. 1, 2014 (KR) ........................ 10-2014-0082027

(51) Int. Cl.
*H04M 1/02* (2006.01)
*G01J 1/02* (2006.01)
(Continued)

(52) U.S. Cl.
CPC ........... *H04M 1/026* (2013.01); *G01J 1/0271* (2013.01); *G01J 1/0414* (2013.01); *G01V 8/10* (2013.01);
(Continued)

(58) Field of Classification Search
CPC .... H04M 1/0266; H04M 1/026; G01J 5/0205; G01J 1/0271; G01V 8/10; H04R 2499/15; H05K 5/0017; H05K 5/03
See application file for complete search history.

(56) References Cited

U.S. PATENT DOCUMENTS 7,236,154 B1 6/2007 Kerr et al.
2010/0078562 A1 4/2010 Dinh et al.
(Continued)

FOREIGN PATENT DOCUMENTS

KR 20-2013-0001694 U 3/2013
KR 10-2013-0082368 A 7/2013
(Continued)

*Primary Examiner* — David Porta
*Assistant Examiner* — Faye Boosalis
(74) *Attorney, Agent, or Firm* — Birch, Stewart, Kolasch & Birch, LLP

(57) ABSTRACT

The present disclosure relates to a proximity illuminance sensor and a mobile terminal using the same, and disclosed is the mobile terminal of which an upper bezel can be shortened by using: the proximity illuminance (IR) sensor disposed on the rear surface of a front case and disposed to be perpendicular to a display unit; and a light reflector disposed at one side of the proximity illuminance sensor, such that light is incident to the proximity illuminance sensor or emitted from the proximity illuminance sensor to the outside.

16 Claims, 18 Drawing Sheets

(51) Int. Cl.
    *G01J 1/04*   (2006.01)
    *H04R 1/02*   (2006.01)
    *H04R 1/34*   (2006.01)
    *H04N 5/225*  (2006.01)
    *H05K 5/03*   (2006.01)
    *H05K 5/00*   (2006.01)
    *G01V 8/10*   (2006.01)

(52) U.S. Cl.
    CPC ........... *H04N 5/2257* (2013.01); *H04R 1/025* (2013.01); *H04R 1/345* (2013.01); *H05K 5/0017* (2013.01); *H05K 5/03* (2013.01); *H04M 2250/12* (2013.01); *H04R 2499/11* (2013.01)

(56) References Cited

U.S. PATENT DOCUMENTS

| | | |
|---|---|---|
| 2011/0164767 A1 | 7/2011 | Goel et al. |
| 2012/0177237 A1 | 7/2012 | Shukla et al. |
| 2012/0206485 A1* | 8/2012 | Osterhout .......... G02B 27/0093 345/633 |
| 2013/0048837 A1 | 2/2013 | Pope et al. |
| 2013/0156245 A1 | 6/2013 | Dix et al. |
| 2013/0203462 A1 | 8/2013 | Tahk et al. |
| 2013/0242479 A1 | 9/2013 | Yoo et al. |
| 2013/0303243 A1* | 11/2013 | Park ................... H04M 1/0206 455/575.7 |
| 2014/0166867 A1 | 6/2014 | Shiu et al. |

FOREIGN PATENT DOCUMENTS

| | | |
|---|---|---|
| KR | 10-2013-0105125 A | 9/2013 |
| KR | 10-2014-0049348 A | 4/2014 |
| KR | 10-2014-0080256 A | 6/2014 |
| WO | WO 2013/128675 A1 | 9/2013 |
| WO | WO 2014/059638 A1 | 4/2014 |

* cited by examiner

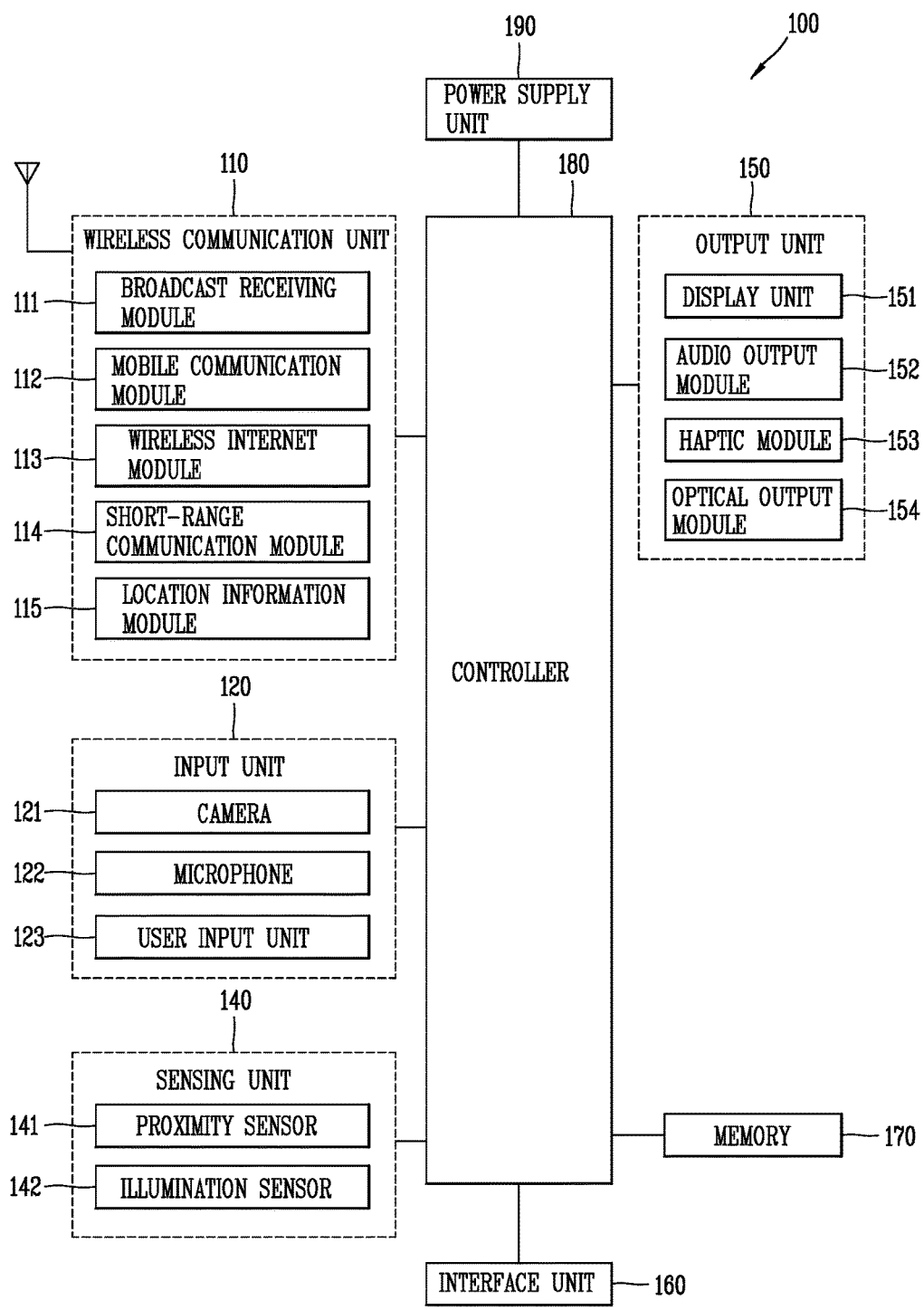

(a)

(b)

PROXIMITY ILLUMINANCE SENSOR MODULE AND MOBILE TERMINAL USING SAME

CROSS REFERENCE TO RELATED APPLICATIONS

This application is the National Phase of PCT International Application No. PCT/KR2015/000423, filed on Jan. 15, 2015, which claims priority under 35 U.S.C. 119(a) to Patent Application No. 10-2014-0082027, filed in Republic of Korea on Jul. 1, 2014, all of which are hereby expressly incorporated by reference into the present application.

TECHNICAL FIELD

The present disclosure relates to a proximity illuminance sensor module capable of implementing a much larger display screen by reducing a size of an upper bezel, and a mobile terminal using the same.

BACKGROUND ART

Terminals may be divided into mobile/portable terminals and stationary terminals according to their mobility. Also, the mobile terminals may be classified into handheld terminals and vehicle mount terminals according to whether or not a user can directly carry.

Mobile terminals have become increasingly more functional. Examples of such functions include data and voice communications, capturing images and video via a camera, recording audio, playing music files via a speaker system, and displaying images and video on a display. Some mobile terminals include additional functionality which supports game playing, while other terminals are configured as multimedia players. More recently, mobile terminals have been configured to receive broadcast and multicast signals which permit viewing of content such as videos and television programs.

As it becomes multifunctional, a mobile terminal can be allowed to capture still images or moving images, play music or video files, play games, receive broadcast and the like, so as to be implemented as an integrated multimedia player.

Efforts are ongoing to support and increase the functionality of mobile terminals. Such efforts include software and hardware improvements, as well as changes and improvements in the structural components.

Meanwhile, a proximity illuminance sensor (infrared (IR) sensor) is disposed on a front surface of a mobile terminal. The proximity illuminance sensor is a sensor of recognizing a user's approach by sensing light. The proximity illuminance sensor is disposed without overlapping a display, which causes a fundamental limit in minimizing a size of an upper bezel.

Also, a receiver is disposed at a non-overlapped area with the display to shorten a sound passage of the receiver, which also interferes with the minimization of the size of the upper bezel.

SUMMARY OF THE INVENTION

The present invention is to obviate those problems and other drawbacks. Another aspect of the present invention is to provide a mobile terminal capable of reducing a size of an upper bezel.

Also, another aspect of the present invention is to prevent deterioration of a high frequency band performance by allowing a sound passage of a receiver to be curved.

To achieve these and other advantages and in accordance with the purpose of the present invention, as embodied and broadly described herein, there is provided a mobile terminal, including a window, a display disposed on a rear surface of the window, a front case having the window and the display mounted thereon and defining a part of appearance, a proximity illuminance (Infrared; IR) sensor disposed on a rear surface of the front case to be perpendicular to the display, and a light reflector disposed at one side of the proximity illuminance sensor such that light is incident to the proximity illuminance sensor or externally output from the proximity illuminance sensor, wherein the light reflector includes a reflective surface for reflecting light, and the reflective surface is arranged such that the light is output to a non-overlapped area with the display.

The reflective surface may form an inclination angle together with the window and the inclination angle may be smaller than or equal to 45°. The angle formed between the reflective surface and the window may be reduced when the light reflector overlaps the display.

The mobile terminal may further include a receiver disposed at one side of the proximity illuminance sensor, formed on a rear surface of the front case, and having an upper end portion located on the same line as or below an upper end portion of the light reflector. The receiver may be arranged to face a front surface and a sound output from the receiver is externally output through a sound passage.

The sound passage may be curved at a bent portion. The mobile terminal may further include a sound leakage preventing pad provided at one side of the sound passage to prevent a sound leakage.

The receiver may be inserted into a receiver insertion hole, and the terminal may further include a sound leakage preventing member covering the sound leakage preventing pad and the receiver insertion hole.

The receiver may be arranged to face a front surface, a first sound passage may be formed by a bracket, and the first sound passage may be connected to a second sound passage formed through an upper end of the front case such that a sound is output through an upper surface of the front case.

The second sound passage may be inclined toward the front surface. A part of the front case may be cut off, and the bracket may be accommodated in the cut-off portion.

The proximity illuminance sensor may be electrically connected to a flexible printed circuit board, and the flexible printed circuit board may be electrically connected to a main printed circuit board. A high-brightness material may be disposed on a rear surface of the light reflector.

The receiver may be perpendicularly formed at the non-overlapped area with the display, a first sound passage may be formed by a bracket, and the first sound passage may be connected to a second sound passage formed through an upper end of the front case such that a sound is output through an upper surface of the front case.

A front camera may be disposed on a lower end of the front case. The front camera may be disposed in a camera hole formed on the front case, and a movement-preventing rib may protrude around the camera hole.

According to another aspect of the present invention, a mobile terminal may include a window, a display disposed on a rear surface of the window, a front case having the window and the display mounted thereon, and a proximity illuminance (Infrared; IR) sensor disposed on a rear surface of the front case, wherein a part of an upper end of the front case is cut off, and glass is disposed in the cut-off portion, wherein a reflective layer is formed on an inner side surface of the upper end of the front case such that light is incident and output to the proximity illuminance sensor, and wherein the proximity illuminance sensor is inclined with respect to the reflective layer such that the light is sensed through the reflective layer.

The front case may be provided a front frame having the display accommodated therein, and the front frame may be provided with a groove for accommodating the proximity illuminance sensor therein.

According to another aspect of the present invention, a proximity illuminance sensor module may include a proximity illuminance sensor, a light reflector accommodating the proximity illuminance sensor and configured in a manner that light is received in the proximity illuminance sensor or externally output from the proximity illuminance sensor, a coupling portion having the proximity illuminance sensor mounted thereon and coupled to the light reflector, and a flexible printed circuit board extending from the coupling portion and having a contact pad formed on one surface thereof, wherein the light reflector comprises a reflective surface for reflecting light, and wherein the reflective surface is formed such that a passage of light incident or reflected to the proximity illuminance sensor is directed to a front side of the light reflector.

Protrusions may be formed on both sides of a lower end of the light reflector and grooves may be formed on both sides of the coupling portion, such that the light reflector is coupled to the coupling portion.

A proximity illuminance sensor module and a mobile terminal using the same according to the present invention can provide the following effects.

According to at least one of embodiments of the present invention, a proximity illuminance sensor can be arranged on an overlapped area with a display by arranging the proximity illuminance sensor perpendicular to a window and reflecting light using a reflective surface. This may result in reducing a size of an upper bezel of the mobile terminal.

Also, the size of the upper bezel can be reduced by arranging a receiver at an overlapped area with a display at a rear surface of the display and forming a sound passage to face a front or upper surface.

In addition, the size of the upper bezel can be reduced by arranging the proximity illuminance sensor at a rear surface of the display and forming a reflective layer at an inner side of an upper end of the display.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the detailed description.

BRIEF DESCRIPTION OF THE DRAWINGS

FIG. 1A is a block diagram of a mobile terminal in accordance with one exemplary embodiment of the present invention.

MODES FOR CARRYING OUT THE PREFERRED EMBODIMENTS

Figure 1B:
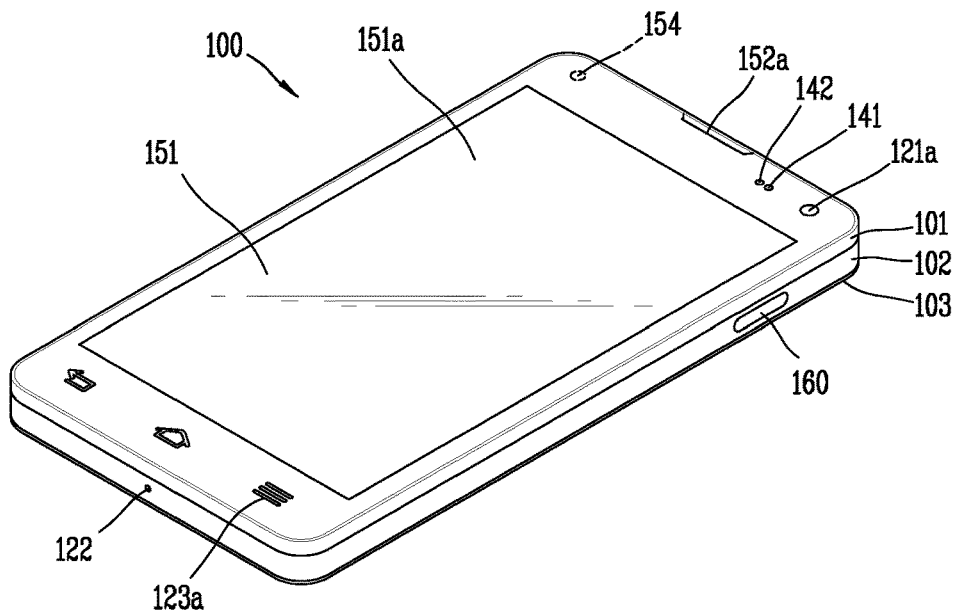
FIGS. 1B and 1C are conceptual views illustrating one example of a mobile terminal, viewed from different directions.

Description will now be given in detail according to exemplary embodiments disclosed herein, with reference to the accompanying drawings. For the sake of brief description with reference to the drawings, the same or equivalent components may be provided with the same or similar reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In describing the present disclosure, moreover, the detailed description will be omitted when a specific description for publicly known technologies to which the invention pertains is judged to obscure the gist of the present disclosure. The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms first, second, etc. may be used herein to describe various elements, these elements should not be limited by these terms. These terms are generally only used to distinguish one element from another.

It will be understood that when an element is referred to as being "connected with" another element, the element can be connected with the other element or intervening elements may also be present. In contrast, when an element is referred to as being "directly connected with" another element, there are no intervening elements present.

A singular representation may include a plural representation unless it represents a definitely different meaning from the context.

Terms such as "include" or "has" are used herein and should be understood that they are intended to indicate an existence of features, numbers, steps, functions, several components, or combinations thereof, disclosed in the specification, and it is also understood that greater or fewer features, numbers, steps, functions, several components, or combinations thereof may likewise be utilized.

Mobile terminals presented herein may be implemented using a variety of different types of terminals. Examples of such terminals include cellular phones, smart phones, user equipment, laptop computers, digital broadcast terminals, personal digital assistants (PDAs), portable multimedia players (PMPs), navigators, slate PCs, tablet PCs, ultra books, wearable devices (for example, smart watches, smart glasses, head mounted displays (HMDs)), and the like.

By way of non-limiting example only, further description will be made with reference to particular types of mobile terminals. However, such teachings apply equally to other types of terminals, such as those types noted above. In addition, these teachings may also be applied to stationary terminals such as digital TV, desktop computers, digital signage, and the like.

Figure 1C:
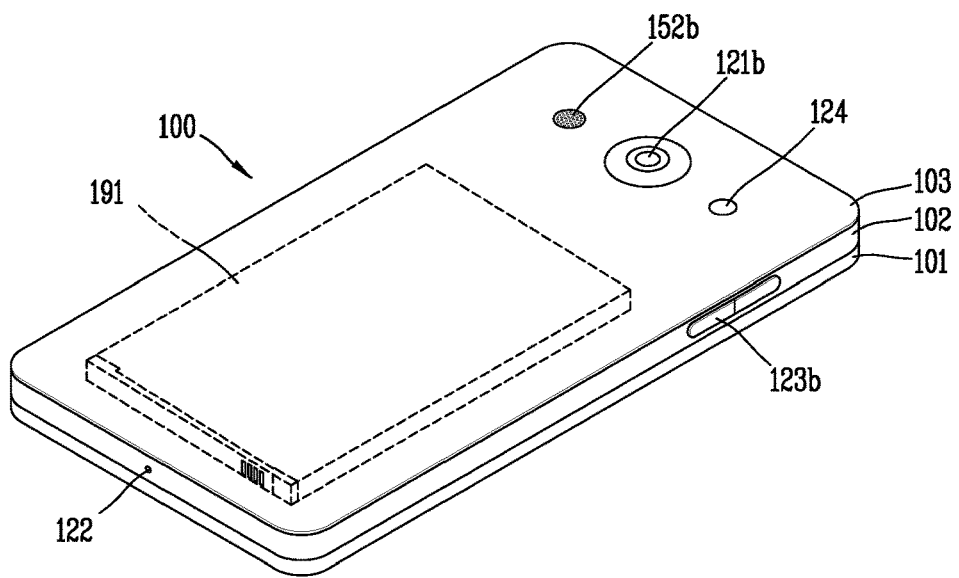

Reference is now made to FIGS. 1A to 1C, where FIG. 1A is a block diagram of a mobile terminal in accordance with the present disclosure, and FIGS. 1B and 1C are conceptual views of one example of the mobile terminal, viewed from different directions.

The mobile terminal 100 may be shown having components such as a wireless communication unit 110, an input unit 120, a sensing unit 140, an output unit 150, an interface unit 160, a memory 170, a controller 180, and a power supply unit 190. It may be understood that implementing all of the illustrated components is not a requirement, and that greater or fewer components may alternatively be implemented.

In more detail, the wireless communication unit 110 among those components may include one or more modules which permit communications such as wireless communications between the mobile terminal 100 and a wireless communication system, communications between the mobile terminal 100 and another mobile terminal, communications between the mobile terminal 100 and an external server. Further, the wireless communication unit 110 may include one or more modules which connect the mobile terminal 100 to one or more networks.

The wireless communication unit 110 may include one or more of a broadcast receiving module 111, a mobile communication module 112, a wireless Internet module 113, a short-range communication module 114, and a location information module 115.

The input unit 120 may include a camera 121 or an image input unit for inputting an image signal, a microphone 122 or an audio input unit for inputting an audio signal, and a user input unit 123 (for example, a touch key, a push key, and the like) for allowing a user to input information. Data (for example, audio, video, image, and the like) is obtained by the input unit 120 and may be analyzed and processed according to user commands.

The sensing unit 140 may be implemented using one or more sensors configured to sense internal information of the mobile terminal, the surrounding environment of the mobile terminal, user information, and the like. For example, the sensing unit 140 is shown having a proximity sensor 141, an illumination sensor 142, a touch sensor, an acceleration sensor, a magnetic sensor, a G-sensor, a gyroscope sensor, a motion sensor, an RGB sensor, an infrared (IR) sensor, a finger scan sensor, a ultrasonic sensor, an optical sensor (for example, camera 121), a microphone 122, a battery gauge, an environment sensor (for example, a barometer, a hygrometer, a thermometer, a radiation detection sensor, a thermal sensor, and a gas sensor, among others), and a chemical sensor (for example, an electronic nose, a health care sensor, a biometric sensor, and the like), to name a few. The mobile terminal 100 may be configured to utilize information obtained from sensing unit 140, and in particular, information obtained from one or more sensors of the sensing unit 140, and combinations thereof.

The output unit 150 may be configured to output various types of information, such as audio, video, tactile output, and the like. The output unit 150 may be shown having a display unit 151, an audio output module 152, a haptic module 153, and an optical output module 154. The display unit 151 may have an inter-layered structure or an integrated structure with a touch sensor in order to facilitate a touch screen. The touch screen may provide an output interface between the mobile terminal 100 and a user, as well as function as the user input unit 123 which provides an input interface between the mobile terminal 100 and the user.

The interface unit 160 serves as an interface with various types of external devices that can be coupled to the mobile terminal 100. The interface unit 160, for example, may include any of wired or wireless ports, external power supply ports, wired or wireless data ports, memory card ports, ports for connecting a device having an identification module, audio input/output (I/O) ports, video I/O ports, earphone ports, and the like. In some cases, the mobile terminal 100 may perform assorted control functions associated with a connected external device, in response to the external device being connected to the interface unit 160.

The memory 170 is typically implemented to store data to support various functions or features of the mobile terminal 100. For instance, the memory 170 may be configured to store application programs executed in the mobile terminal 100, data or instructions for operations of the mobile terminal 100, and the like. Some of these application programs may be downloaded from an external server via wireless communication. Other application programs may be installed within the mobile terminal 100 at time of manufacturing or shipping, which is typically the case for basic functions of the mobile terminal 100 (for example, receiving a call, placing a call, receiving a message, sending a message, and the like). It is common for application programs to be stored in the memory 170, installed in the mobile terminal 100, and executed by the controller 180 to perform an operation (or function) for the mobile terminal 100.

The controller 180 typically functions to control overall operation of the mobile terminal 100, in addition to the operations associated with the application programs. The controller 180 may provide or process information or functions appropriate for a user by processing signals, data, information and the like, which are input or output by the aforementioned various components, or activating application programs stored in the memory 170.

Also, the controller 180 controls some or all of the components illustrated in FIG. 1A to execute an application program that have been stored in the memory 170. Also, the controller 180 may operate at least two components included in the mobile terminal 100 in a combining manner to activate the application program.

The power supply unit 190 can be configured to receive external power or provide internal power, under the control of the controller, in order to supply appropriate power required for operating elements and components included in the mobile terminal 100. The power supply unit 190 may include a battery, and the battery may be configured to be embedded in the terminal body, or configured to be detachable from the terminal body.

At least some of those components may be combined for operation to implement an operation, a control or a control method of the mobile terminal according to various embodiments disclosed herein. Also, the operation, the control or the control method of the mobile terminal may be implemented on the mobile terminal by activating at least one application program stored in the memory 170.

Referring now to FIGS. 1B and 1C, the mobile terminal 100 is described with reference to a bar-type terminal body. However, the mobile terminal 100 may alternatively be implemented in any of a variety of different configurations. Examples of such configurations include watch type, clip-type, glasses-type, or as a folder-type, flip-type, slide-type, swing-type, and swivel-type in which two and more bodies are combined with each other in a relatively movable manner, and combinations thereof. Discussion herein will often relate to a particular type of mobile terminal (for example, bar-type, watch type, glasses-type, and the like). However, such teachings with regard to a particular type of mobile terminal will generally apply to other types of mobile terminals as well.

Here, considering the mobile terminal 100 as at least one assembly, the terminal body may be understood as a conception referring to the assembly.

The mobile terminal 100 will generally include a case (for example, frame, housing, cover, and the like) forming the appearance of the terminal. In this embodiment, the case is formed using a front case 101 and a rear case 102. Various electronic components are incorporated into a space formed between the front case 101 and the rear case 102. At least one middle case may be additionally positioned between the front case 101 and the rear case 102.

The display unit 151 is shown located on the front side of the terminal body to output information. As illustrated, a window 151a of the display unit 151 may be mounted to the front case 101 to form the front surface of the terminal body together with the front case 101.

In some embodiments, electronic components may also be mounted to the rear case 102. Examples of such electronic components include a detachable battery 191, an identification module, a memory card, and the like. Rear cover 103 is shown covering the electronic components, and this cover may be detachably coupled to the rear case 102. Therefore, when the rear cover 103 is detached from the rear case 102, the electronic components mounted to the rear case 102 are externally exposed.

As illustrated, when the rear cover 103 is coupled to the rear case 102, a side surface of the rear case 102 is partially exposed. In some cases, upon the coupling, the rear case 102 may also be completely shielded by the rear cover 103. In some embodiments, the rear cover 103 may include an opening for externally exposing a camera 121b or an audio output module 152b.

The cases 101, 102, 103 may be formed by injection-molding synthetic resin or may be formed of a metal, for example, stainless steel (STS), aluminum (Al), titanium (Ti), or the like.

As an alternative to the example in which the plurality of cases form an inner space for accommodating components, the mobile terminal 100 may be configured such that one case forms the inner space. In this example, a mobile terminal 100 having a uni-body is formed in such a manner that synthetic resin or metal extends from a side surface to a rear surface.

If desired, the mobile terminal 100 may include a waterproofing unit (not shown) for preventing introduction of water into the terminal body. For example, the waterproofing unit may include a waterproofing member which is located between the window 151a and the front case 101, between the front case 101 and the rear case 102, or between the rear case 102 and the rear cover 103, to hermetically seal an inner space when those cases are coupled.

The mobile terminal 100 may include a display unit 151, first and second audio output module 152a and 152b, a proximity sensor 141, an illumination sensor 142, an optical output module 154, first and second cameras 121a and 121b, first and second manipulation units 123a and 123b, a microphone 122, an interface unit 160, and the like.

Hereinafter, as illustrated in FIGS. 1B and 1C, description will be given of the exemplary mobile terminal 100 in which the front surface of the terminal body is shown having the display unit 151, the first audio output module 152a, the proximity sensor 141, the illumination sensor 142, the optical output module 154, the first camera 121a, and the first manipulation unit 123a, the side surface of the terminal body is shown having the second manipulation unit 123b, the microphone 122, and the interface unit 160, and the rear surface of the terminal body is shown having the second audio output module 152b and the second camera 121b.

However, those components may not be limited to the arrangement. Some components may be omitted or rearranged or located on different surfaces. For example, the first manipulation unit 123a may be located on another surface of the terminal body, and the second audio output module 152b may be located on the side surface of the terminal body other than the rear surface of the terminal body.

The display unit 151 outputs information processed in the mobile terminal 100. For example, the display unit 151 may display execution screen information of an application program executing at the mobile terminal 100 or user interface (UI) and graphic user interface (GUI) information in response to the execution screen information.

The display unit 151 may be implemented using one or more suitable display devices. Examples of such suitable display devices include a liquid crystal display (LCD), a thin film transistor-liquid crystal display (TFT-LCD), an organic light emitting diode (OLED), a flexible display, a 3-dimensional (3D) display, an e-ink display, and combinations thereof.

The display unit 151 may be implemented using two display devices, which can implement the same or different display technology. For instance, a plurality of the display units 151 may be arranged on one side, either spaced apart from each other, or these devices may be integrated, or these devices may be arranged on different surfaces.

The display unit 151 may also include a touch sensor which senses a touch input received at the display unit. When a touch is input to the display unit 151, the touch sensor may be configured to sense this touch and the controller 180, for example, may generate a control command or other signal corresponding to the touch. The content which is input in the touching manner may be a text or numerical value, or a menu item which can be indicated or designated in various modes.

The touch sensor may be configured in a form of a film having a touch pattern, disposed between the window 151a and a display on a rear surface of the window 151a, or a metal wire which is patterned directly on the rear surface of the window 151a. Alternatively, the touch sensor may be integrally formed with the display. For example, the touch sensor may be disposed on a substrate of the display or within the display.

The display unit 151 may also form a touch screen together with the touch sensor. Here, the touch screen may serve as the user input unit 123 (see FIG. 1A). Therefore, the touch screen may replace at least some of the functions of the first manipulation unit 123a.

The first audio output module 152a may be implemented in the form of a receiver for transferring call sounds to a user's ear and the second audio output module 152b may be implemented in the form of a loud speaker to output alarm sounds, multimedia audio reproduction, and the like.

The window 151a of the display unit 151 will typically include an aperture to permit audio generated by the first audio output module 152a to pass. One alternative is to allow audio to be released along an assembly gap between the structural bodies (for example, a gap between the window 151a and the front case 101). In this case, a hole independently formed to output audio sounds may not be seen or is otherwise hidden in terms of appearance, thereby further simplifying the appearance and manufacturing of the mobile terminal 100.

The optical output module 154 can be configured to output light for indicating an event generation. Examples of such events include a message reception, a call signal reception, a missed call, an alarm, a schedule alarm, an email reception, information reception through an application, and the like. When a user has checked a generated event, the controller 180 can control the optical output module 154 to stop the light output.

The first camera 121a can process image frames such as still or moving images obtained by the image sensor in a capture mode or a video call mode. The processed image frames can then be displayed on the display unit 151 or stored in the memory 170.

The first and second manipulation units 123a and 123b are examples of the user input unit 123, which may be manipulated by a user to provide input to the mobile terminal 100. The first and second manipulation units 123a and 123b may also be commonly referred to as a manipulating portion, and may employ any tactile method that allows the user to perform manipulation such as touch, push, scroll, or the like. The first and second manipulation units 123a and 123b may also employ any non-tactile method that allows the user to perform manipulation such as proximity touch, hovering, or the like.

FIG. 1B illustrates the first manipulation unit 123a as a touch key, but possible alternatives include a push (or mechanical) key, a touch key, and combinations thereof.

Input received at the first and second manipulation units 123a and 123b may be used in various ways. For example, the first manipulation unit 123a may be used by the user to provide an input to a menu, home key, cancel, search, or the like, and the second manipulation unit 123b may be used by the user to provide an input to control a volume level being output from the first or second audio output modules 152a or 152b, to switch to a touch recognition mode of the display unit 151, or the like.

As another example of the user input unit 123, a rear input unit (not shown) may be located on the rear surface of the terminal body. The rear input unit can be manipulated by a user to provide input to the mobile terminal 100. The input may be used in a variety of different ways. For example, the rear input unit may be used by the user to provide an input for power on/off, start, end, scroll, control volume level being output from the first or second audio output modules 152a or 152b, switch to a touch recognition mode of the display unit 151, and the like. The rear input unit may be configured to permit touch input, a push input, or combinations thereof.

The rear input unit may be located to overlap the display unit 151 of the front side in a thickness direction of the terminal body. As one example, the rear input unit may be located on an upper end portion of the rear side of the terminal body such that a user can easily manipulate it using a forefinger when the user grabs the terminal body with one hand. Alternatively, the rear input unit can be positioned at most any location of the rear side of the terminal body.

When the rear input unit is provided on the rear surface of the terminal body, a new type of user interface using this can be implemented. Embodiments that include the rear input unit may implement some or all of the functionality of the first manipulation unit 123a in the rear input unit. As such, in situations where the first manipulation unit 123a is omitted from the front side, the display unit 151 can have a larger screen.

As a further alternative, the mobile terminal 100 may include a finger scan sensor which scans a user's fingerprint. The controller 180 can then use fingerprint information sensed by the finger scan sensor as part of an authentication procedure. The finger scan sensor may also be installed in the display unit 151 or implemented in the user input unit 123.

The microphone 122 is shown located at an end of the mobile terminal 100, but other locations are possible. If desired, multiple microphones may be implemented, with such an arrangement permitting the receiving of stereo sounds.

The interface unit 160 may serve as a path allowing the mobile terminal 100 to interface with external devices. For example, the interface unit 160 may include one or more of a connection terminal for connecting to another device (for example, an earphone, an external speaker, or the like), a port for near field communication (for example, an Infrared Data Association (IrDA) port, a Bluetooth port, a wireless LAN port, and the like), or a power supply terminal for supplying power to the mobile terminal 100. The interface unit 160 may be implemented in the form of a socket for accommodating an external card, such as Subscriber Identification Module (SIM), User Identity Module (UIM), or a memory card for information storage.

The second camera 121b is shown located at the rear side of the terminal body and includes an image capturing direction that is substantially opposite to the image capturing direction of the first camera unit 121a.

The second camera 121b can include a plurality of lenses arranged along at least one line. The plurality of lenses may also be arranged in a matrix configuration. The cameras may be referred to as an "array camera." When the second camera 121b is implemented as an array camera, images may be captured in various manners using the plurality of lenses and images with better qualities.

A flash 124 is shown adjacent to the second camera 121b. When an image of a subject is captured with the camera 121b, the flash 124 may illuminate the subject.

The second audio output module 152b can be located on the terminal body. The second audio output module 152b may implement stereophonic sound functions in conjunction with the first audio output module 152a, and may be also used for implementing a speaker phone mode for call communication.

At least one antenna for wireless communication may be located on the terminal body. The antenna may be installed in the terminal body or formed by the case. For example, an antenna which configures a part of the broadcast receiving module 111 (see FIG. 1A) may be retractable into the terminal body. Alternatively, an antenna may be formed using a film attached to an inner surface of the rear cover 103, or a case that includes a conductive material.

A power supply unit 190 for supplying power to the mobile terminal 100 may include a battery 191, which is mounted in the terminal body or detachably coupled to an outside of the terminal body.

The battery 191 may receive power via a power source cable connected to the interface unit 160. Also, the battery 191 can be recharged in a wireless manner using a wireless charger. Wireless charging may be implemented by magnetic induction or electromagnetic resonance.

The rear cover 103 is shown coupled to the rear case 102 for shielding the battery 191, to prevent separation of the battery 191, and to protect the battery 191 from an external impact or from foreign material. When the battery 191 is detachable from the terminal body, the rear case 103 may be detachably coupled to the rear case 102.

An accessory for protecting an appearance or assisting or extending the functions of the mobile terminal 100 can also be provided on the mobile terminal 100. As one example of an accessory, a cover or pouch for covering or accommodating at least one surface of the mobile terminal 100 may be provided. The cover or pouch may cooperate with the display unit 151 to extend the function of the mobile terminal 100. Another example of the accessory is a touch pen for assisting or extending a touch input to a touch screen.

Hereinafter, description will be given of related embodiments of a mobile terminal having such configuration with reference to the accompanying drawings. It will be understood by those skilled in the art that the present invention can be specified into other specific forms without departing from the spirit and essential features of the present invention.

Figure 2:
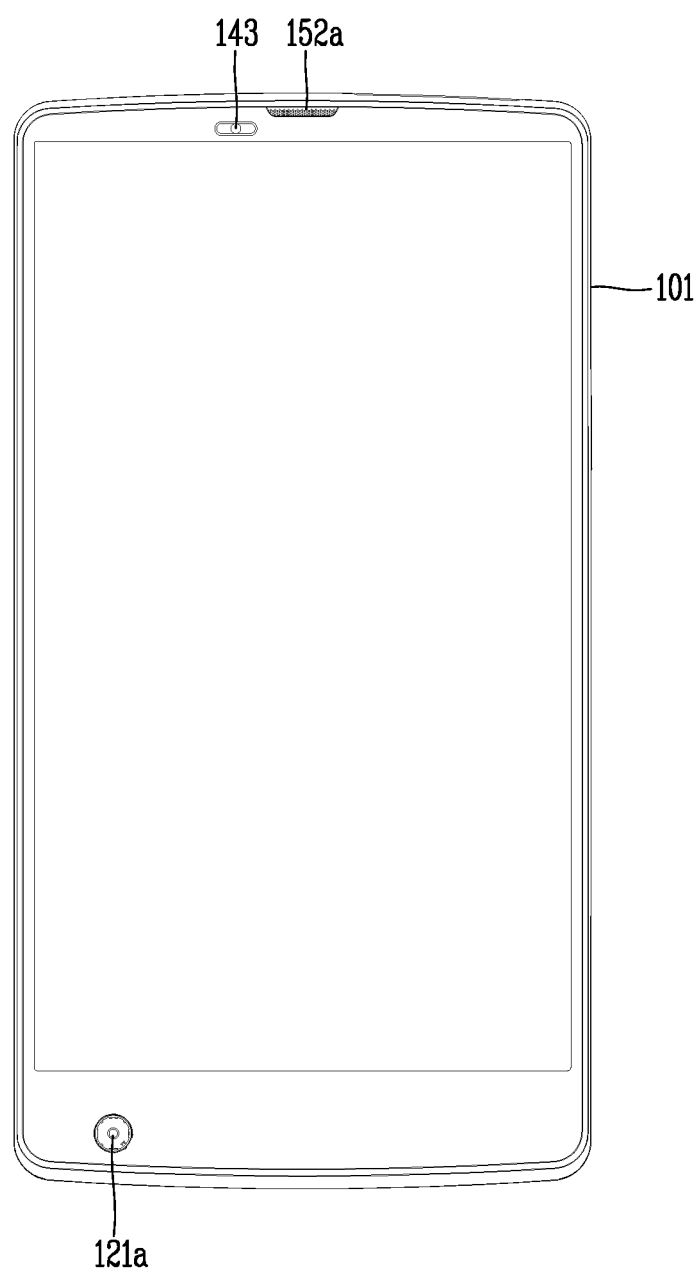
FIG. 2 is a front view of a mobile terminal in accordance with the present invention.

FIG. 2 is a front view of a mobile terminal in accordance with the present invention. As illustrated in FIG. 2, a light reflector 143 allowing a proximity illuminance sensor 142 to sense light, and a receiver 152a may be disposed on an upper end portion of a front surface of the mobile terminal, to reduce a size of an upper bezel.

Also, in the related art, a front camera 121a which was arranged near the proximity illuminance sensor 142 and the receiver 152a in the related art is arranged on a lower end of the front surface and accordingly an upper bezel of the mobile terminal can be reduced while maintaining a lower bezel of the mobile terminal.

Hereinafter, a method of reducing the size of the upper bezel of the mobile terminal will be described, with reference to FIG. 3.

Figure 3A:
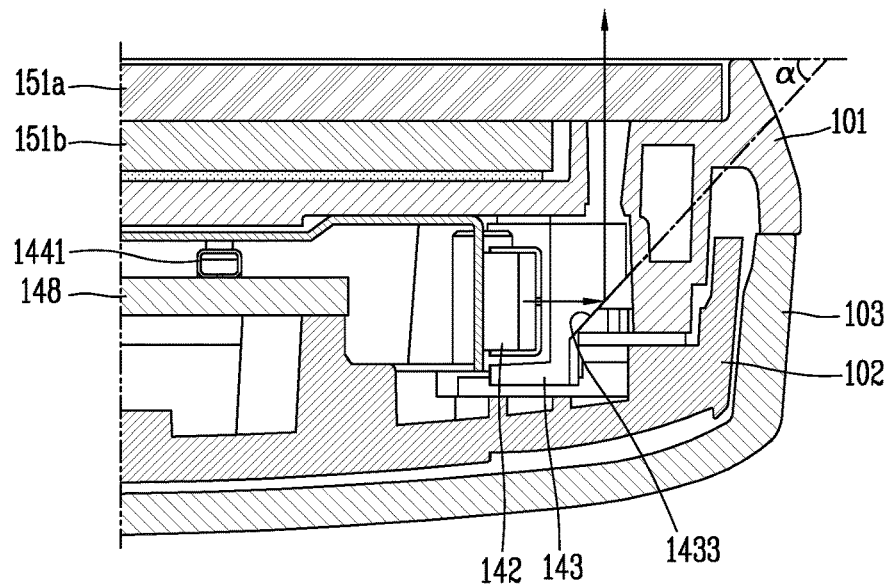
FIGS. 3A to 3C are views illustrating a side cross section of a mobile terminal and a partial rear surface of a front case.

FIG. 3 is a view illustrating arrangement of the proximity illuminance sensor 142, the receiver 152a and the front camera 121a in accordance with one embodiment of the present invention. As illustrated in FIG. 3A, the mobile terminal according to the one embodiment of the present invention includes a window 151a disposed on the outermost surface, a display 151b disposed on a rear surface of the window 151a to output an image signal, a front case 101 having the window 151a and the display 151b thereon and defining a part of appearance in the state that the window 151a and the display 151b are disposed thereon, a proximity illuminance (IR) sensor 142 disposed on a rear surface of the front case 101, and a light reflector 143 disposed at one side of the proximity illuminance sensor 142 such that light can be received in the proximity illuminance sensor 142 or emitted to the exterior from the proximity illuminance sensor 142.

In this instance, the proximity illuminance sensor 142 is arranged perpendicular to the display 151b. In the related art, the proximity illuminance sensor 142 has been arranged at a non-overlapped area with the display 151b and simultaneously arranged to face the front surface. Accordingly, an occupied area of the proximity illuminance sensor 142 has interfered with a reduction of the size of the upper bezel. The front camera 121a, as illustrated in FIG. 3C, is disposed in a camera hole 1211 formed on the front case 101, and a movement-preventing rib 1213 protrudes around the camera hole 1211.

The one embodiment of the present invention illustrates that the proximity illuminance sensor 142 is arranged perpendicular to the display 151b and light is incident or reflected to the proximity illuminance sensor 142 by the light reflector 143 which is disposed above the proximity illuminance sensor 142. The light reflector 143 includes a reflective surface 1433 for reflecting light, and the reflective surface 1433 is disposed such that the light is emitted to the non-overlapped area with the display 151b. That is, the reflective surface 1433 has a function similar to a mirror.

Hereinafter, a front surface of the mobile terminal 100 refers to a surface that a principle surface of the window 151a faces, and an upper surface of the mobile terminal 100 is a surface perpendicular to the front surface, namely, refers to a surface formed in a thickness direction.

In accordance with the one embodiment of the present invention, the employment of the light reflector 143 in addition to the proximity illuminance sensor 142 results in controlling a light movement path. That is, as illustrated in FIG. 3A, even though the proximity illuminance sensor 142 is disposed at a rear surface of the display 151b, light is allowed to be transferred to the exterior using the light reflector 143. As such, upon using the light reflector 143, a position at which light is transferred to the exterior can be adjusted. The reflective surface 1433 is inclined from the window 151a. The position at which light is transferred to the outside through the window 151a is adjusted by adjusting an inclination angle α of the reflective surface 1433. For example, when the reflective surface 1433 is inclined with respect to the window 151a by 45°, light reflected from the proximity illuminance sensor 142 is reflected from the reflective surface 1433 in a perpendicular direction to the window 151a so as to be transferred to the outside. If the inclination angle α is smaller than 45°, the light is transferred to the outside through an upper portion of the reflective surface 1433, compared with the inclination angle α of 45°. Therefore, the one embodiment of the present invention illustrates that a size of the inclination angle between the window 151a and the reflective surface 1433 is limited blow 45°.

If the inclination angle is greater than 45°, the light reflected from the reflective surface 1433 is transferred to the outside through a lower portion of the reflective surface 1433. Therefore, it does not coincide with the purpose of the present invention for reducing the upper bezel. However, if the proximity illuminance sensor 142 and the light reflector 143 are located with being more spaced apart from the display 151b, the size of the upper bezel can be reduced even when the inclination angle is greater than 45°, but this causes a problem of increasing a thickness of the mobile terminal.

In accordance with the one embodiment of the present invention, light can be transferred to outside if only at least a part of the reflective surface 1433 is arranged at the non-overlapped area with an area of the display 151*b* even though the proximity illuminance sensor 142 is completely included in the area of the display 151*b*, by way of arranging the proximity illuminance sensor 142 and the light reflector 143 at the rear surface of the display 151*b* and controlling a light movement path (arrow in FIG. 3A).

However, the inclination angle formed between the reflective surface 1433 and the window 151*a* is more reduced as the light reflector 143 and the display 151*b* more overlap each other, and light reflected from the reflective surface 1433 has a greater reflection angle when the inclination angle is more reduced. Therefore, an excessive overlap between the light reflector 143 and the display 151*b* is not needed.

That is, the adjustment of the inclination angle should be executed within a range that the reflected light from the reflective surface 1433 is not output out of an upper end of the window 151*a*.

Figure 3B:
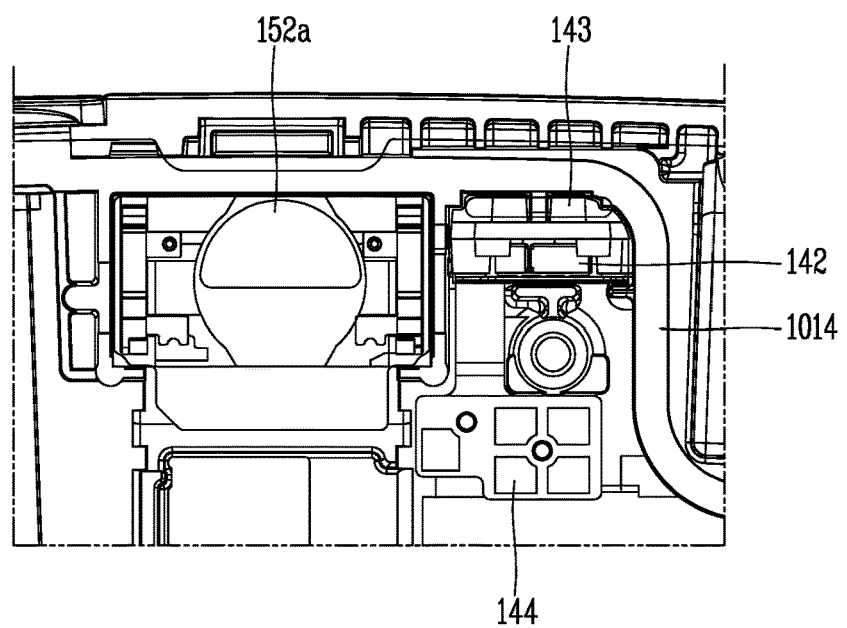
Figure 3C:
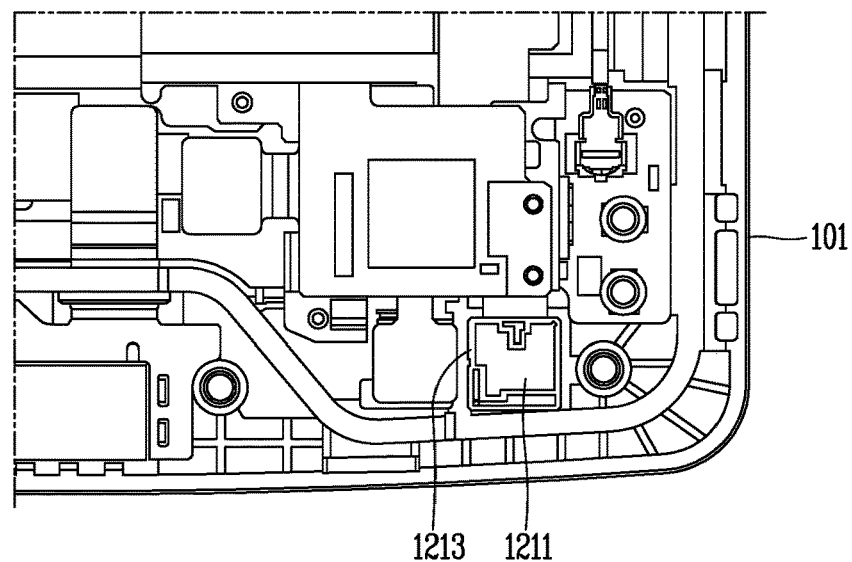

FIG. 3B illustrates a receiver 152*a* that is disposed on a rear surface of the front case 101 at one side of the proximity illuminance sensor 142, and has an upper end portion located on the same line as or below an upper end portion of the light reflector 143.

The receiver 152*a* may also be disposed lower than the upper end portion of the light reflector 143, but should avoid from being arranged excessively lower than the upper end portion of the light reflector 143 due to causing an extended sound passage. According to one embodiment of the present invention, a sound output from the receiver 152*a* is discharged to outside through a sound passage 152' that is curved toward a front surface.

The sound passage 152' is arched at curved portions 1011, 1012 and 1013. According to one embodiment of the present invention, the shape of the sound passage 152' is prevented from being sharply bent to avoid interference with a high frequency band performance. This will be described with reference to FIG. 4.

Figure 4:
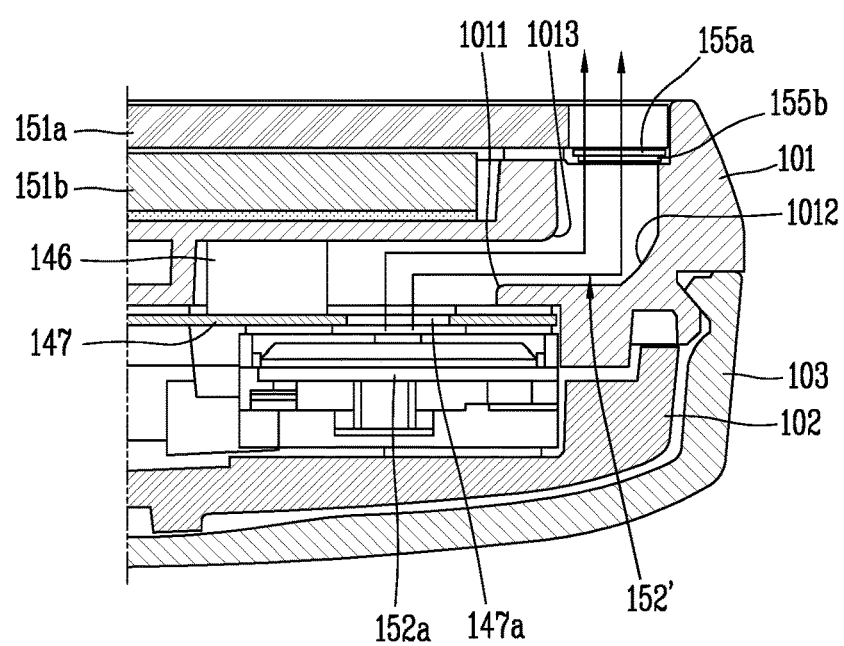
FIG. 4 is a lateral sectional view illustrating a part of a mobile terminal according to the present invention.

FIG. 4 is a partial sectional view of the mobile terminal 100 including the receiver 152*a* in accordance with one embodiment of the present invention. The receiver 152*a* is disposed to face the front surface and a sound output from a front end of the receiver 152*a* is externally emitted along the sound passage 152'.

Meanwhile, referring to FIG. 8, the front case 101 has a structure that a sound is output to the front surface of the front case 101 by being bent (turned) through the receiver 152*a* disposed on the rear surface of the front case 101. Here, a bent portion in a mold structure (including a part A of FIG. 9B) should be implemented using a deformed ejector pin 205. As such, if the bent portion is implemented using the deformed ejector pin 205, a greater space than an actual size of the receiver 152*a* should be ensured due to an extracted stroke.

Figure 9A:
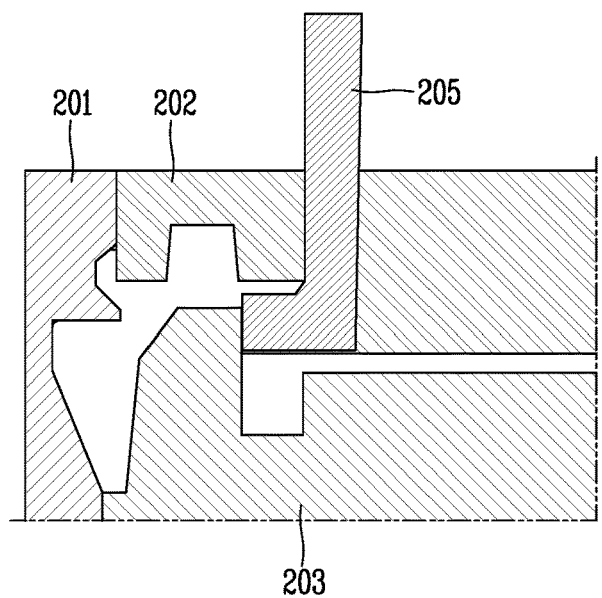
FIGS. 9A and 9B are views illustrating a sound passage producing process of a mobile terminal according to the present invention.
Figure 9B:
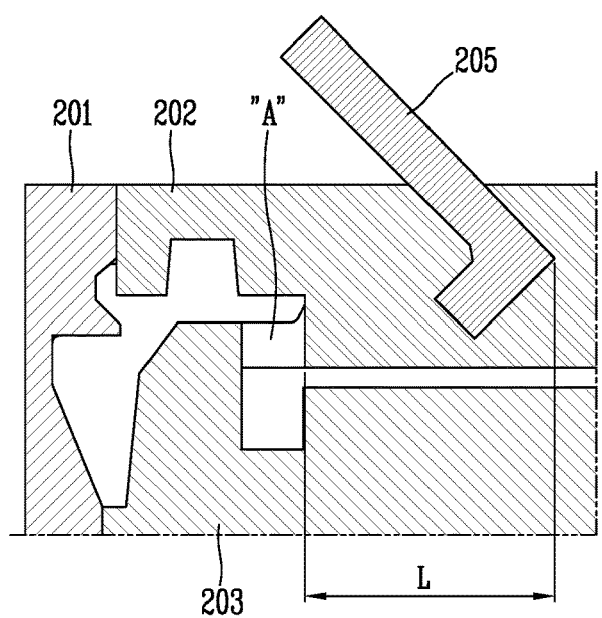

FIG. 9 illustrates a process of fabricating the front case 101 having the sound passage 152' according to one embodiment of the present invention. The sound passage 152' is fabricated by a mold structure including a slide core 201, an upper core 202 and a lower core 203. In this instance, an under-cut portion A, as illustrated in FIG. 9B, is fabricated using the deformed ejector pin 205. Accordingly, a minimum stroke (L) section required for a turn of the deformed ejector pin 205 is generated. This results in unnecessarily extending the sound passage 152'.

According to the one embodiment of the present invention, a sound leakage preventing pad 146 for preventing a leakage of sounds is disposed in a direction opposite to an output direction of the sounds of the sound passage 152'. The receiver 152*a* is then inserted into a receiver insertion hole 146*a*. Afterwards, the receiver insertion hole 146*a* is covered with a sound leakage preventing member 147 for preventing a leakage of sounds to the exterior.

Figure 8A:
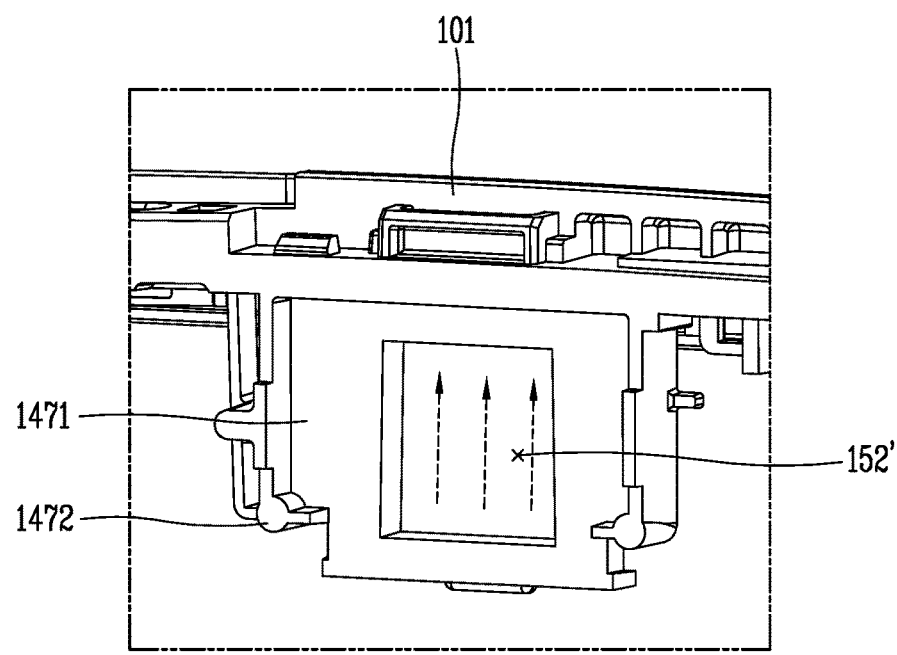
FIGS. 8A to 8C are views illustrating a sound passage of a mobile terminal according to the present invention.
Figure 8B:
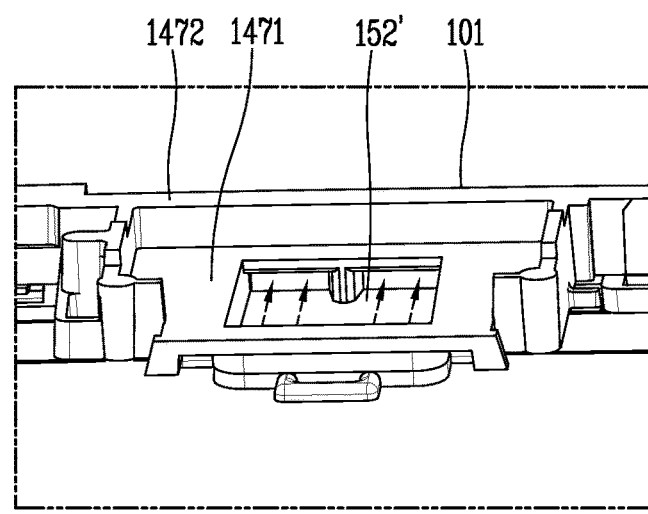
Figure 10A:
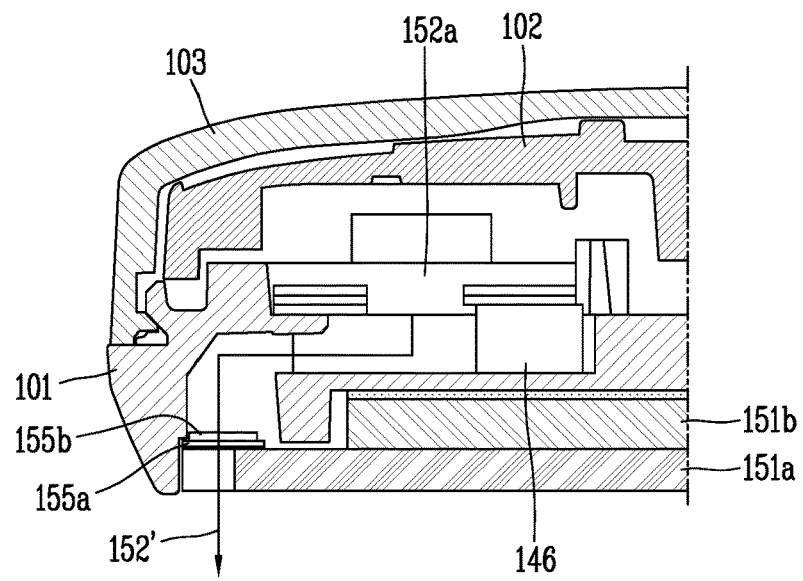
FIGS. 10A and 10B are views illustrating a structure for preventing sound leakage of a mobile terminal according to the present invention.
Figure 10B:
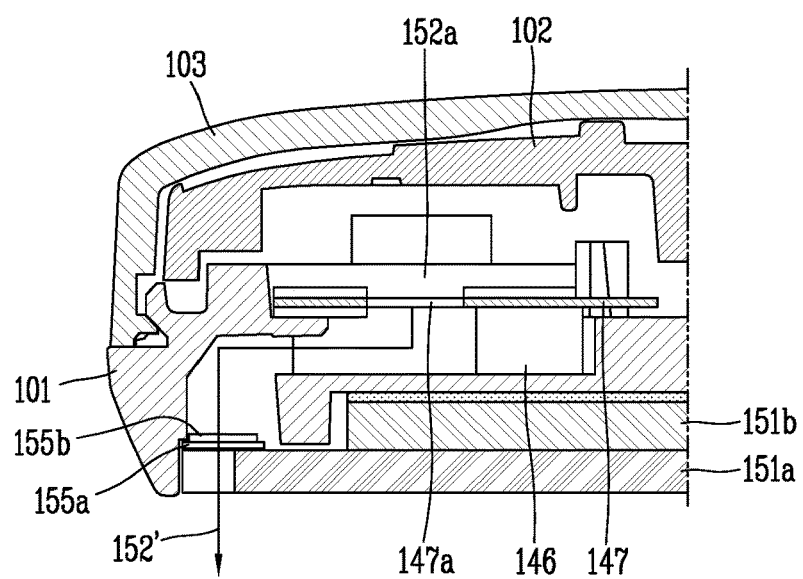

That is, FIG. 10 illustrates a sound leakage preventing structure of the mobile terminal according to the present invention. A sound leakage is caused due to the ensured space. To prevent this, the sound leakage preventing pad 146 is primarily applied to prevent the sound leakage. To secondarily prevent the sound leakage, the sound leakage preventing member 147 is added such that the sound is well bent (turned) from an output portion without a sound leakage to be transferred to the front surface portion. Also, the receiver 152*a* should stably be fixed to the front case 101. As illustrated in FIGS. 8A and 8B, the receiver 152*a* with a flat front surface portion is easily mounted on a receiver mounting portion 1471 which is evenly formed on the front case 101. Also, a mounting space of the receiver 152*a* is formed by a rib 1472 that protrudes around the receiver mounting portion 1471, and the receiver 152*a* is accommodated in the space. That is, after the sound leakage preventing member 147 is mounted on the receiver mounting portion 147, the receiver 162*a* is disposed on a rear surface of the sound leakage preventing member 147. In this instance, the sound leakage preventing member 147 may be made of stainless steel, and the sound leakage preventing pad 146 may use poron or sponge.

In order to transfer sounds output from the receiver 152*a*, which is disposed at the rear surface of the display 151*b*, to the outside through an upper end of a front surface of the window 151*a*, the sound passage 152' is bent at at least two points. The sound transfer is not smoothly executed when the bent portions 1011, 1012 and 1013 are more angular. That is, if each of the bent portions 1011, 1012 and 1013 of the sound passage 152' is formed at a right angle, a sound that is curved at the right-angle portion and a sound reflected from the right-angle portion interfere with each other, which may badly affect the high frequency band performance. Therefore, in the one embodiment of the present invention, the bent portions 1011, 1012 and 1013 are formed in the curved shape.

Figure 6A:
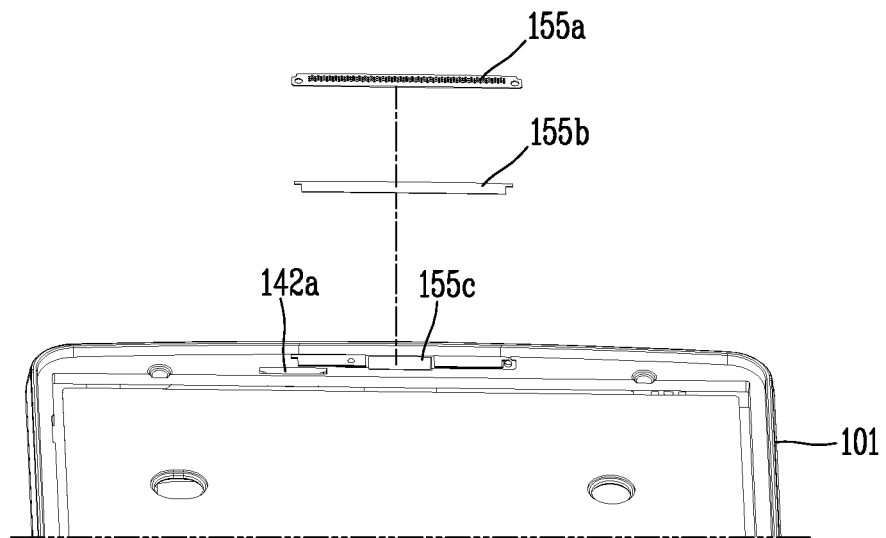
FIGS. 6A and 6B are views illustrating states before and after a receiver part of a mobile terminal is assembled.
Figure 6B:
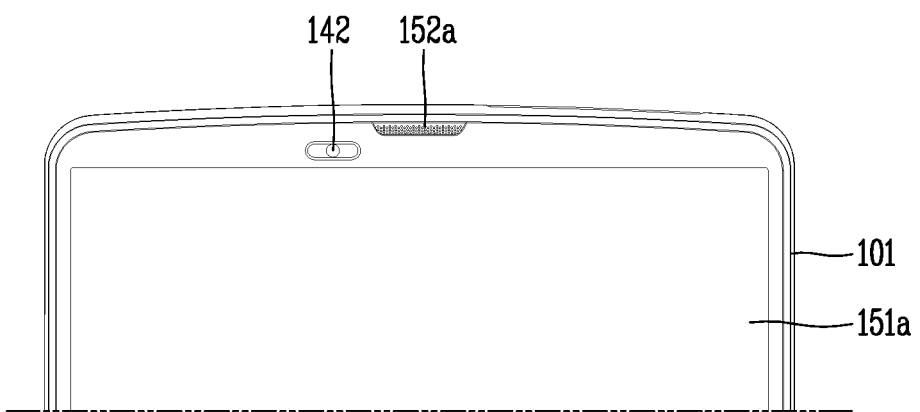

FIG. 6 illustrates a process of assembling a front surface portion of the receiver 152*a* in accordance with one embodiment of the present invention. A receiver filter 155*b* for preventing an introduction of foreign materials into a filter insertion hole 155*c* is attached on the front case 101, and a deco-receiver 155*a* is coupled to the receiver filter 155*b*. FIG. 6A illustrates a state before assembly, and FIG. 6B illustrates a state after assembly. A hole 142*a* allowing light to be incident or reflected to the proximity illuminance sensor 142 is formed at one side of the filter insertion hole 155*c*.

Figure 7A:
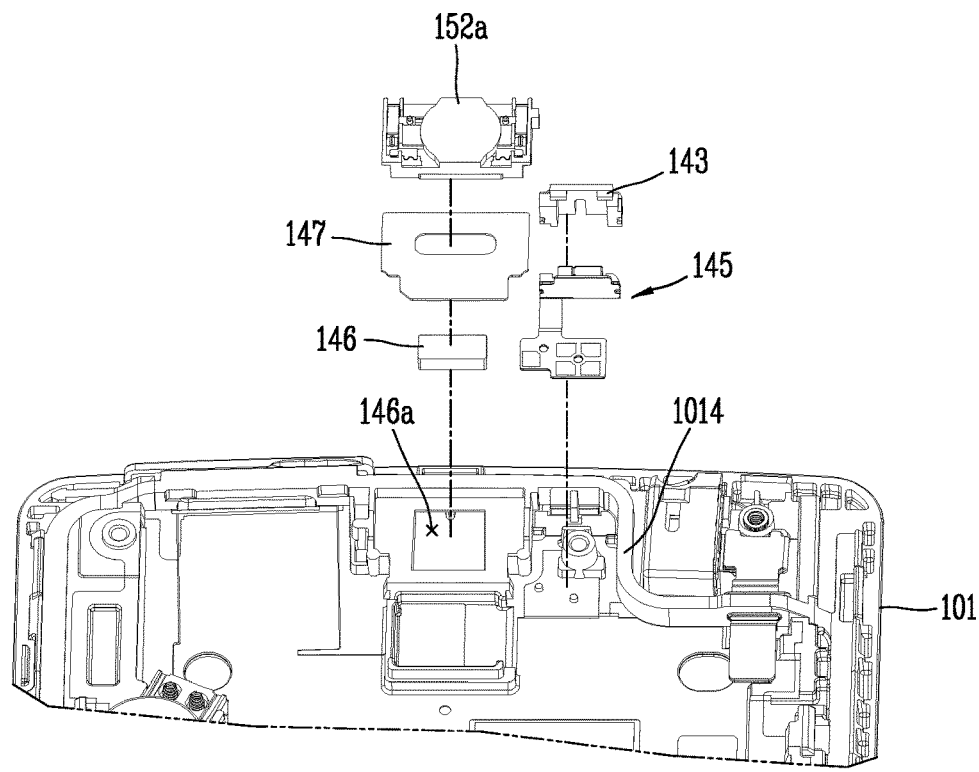
FIGS. 7A and 7B are views illustrating states before and after coupling a receiver and a proximity illuminance sensor of a mobile terminal according to the present invention.

FIG. 7 is a perspective view before and after coupling the receiver 152*a* and the proximity illuminance sensor 142 in accordance with one embodiment of the present invention. As illustrated in FIG. 7A, the receiver insertion hole 146*a* is formed on the front case 101, and at least part of the receiver insertion hole 146*a* forms the sound passage 152'. The sound leakage preventing pad 146 is inserted to block a part of the sound passage 152', and the sound leakage preventing member 147 covers the receiver insertion hole 146*a*. A sound hole 147*a* is formed through the sound leakage preventing member 147. Accordingly, a sound output from the receiver 152a is transferred to the sound passage 152' through the sound hole 147a. When the sound leakage preventing member 147 is coupled, the receiver 152a is assembled on the sound leakage preventing member 147.

Figure 7B:
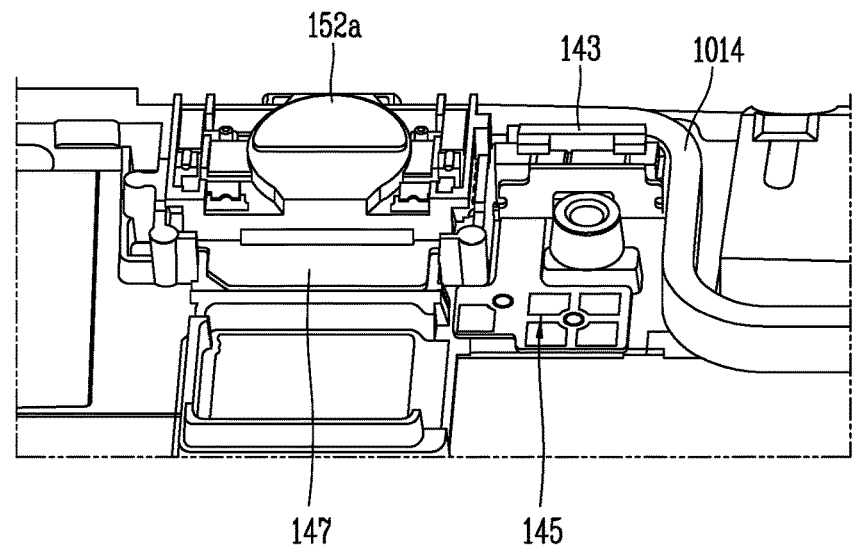

As illustrated in FIGS. 7A and 7B, to arrange the receiver 152a and the proximity illuminance sensor 142 close to each other, a rib 1014 protrude from the rear surface of the front case 101. The rib 1014 divides arrangement areas of the receiver 152a and the proximity illuminance sensor 142.

Figure 8C:
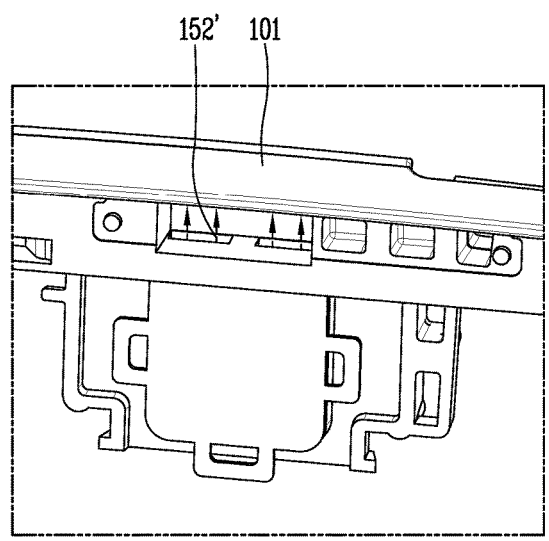

Meanwhile, the sound passage 152' is illustrated in FIG. 8. FIGS. 8A to 8C are a top perspective view, a bottom perspective view and a rear perspective view of the sound passage 152' formed on the front case 101, respectively.

The sound leakage preventing member 147 covers the receiver insertion hole 146a illustrated in FIG. 8 and a surrounding portion of the receiver insertion hole 146a.

Figure 14A:
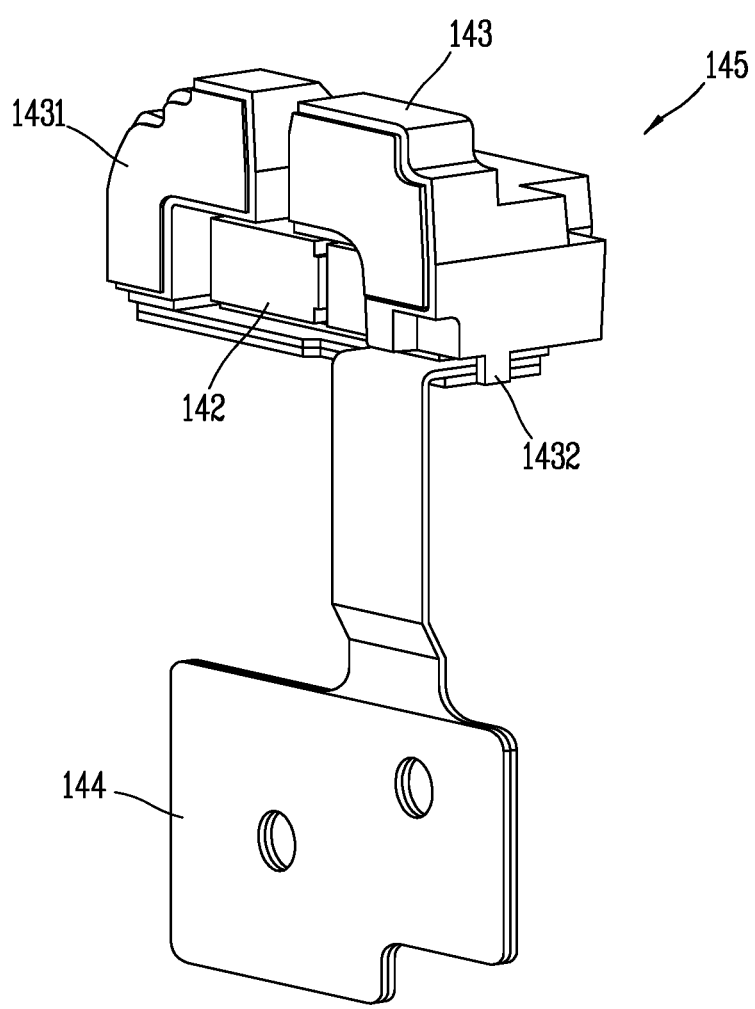
FIGS. 14A and 14B are views illustrating a disassembled perspective view of a proximity illuminance sensor module and a perspective view after assembling the proximity illuminance sensor module, in accordance with the present invention.
Figure 14B:
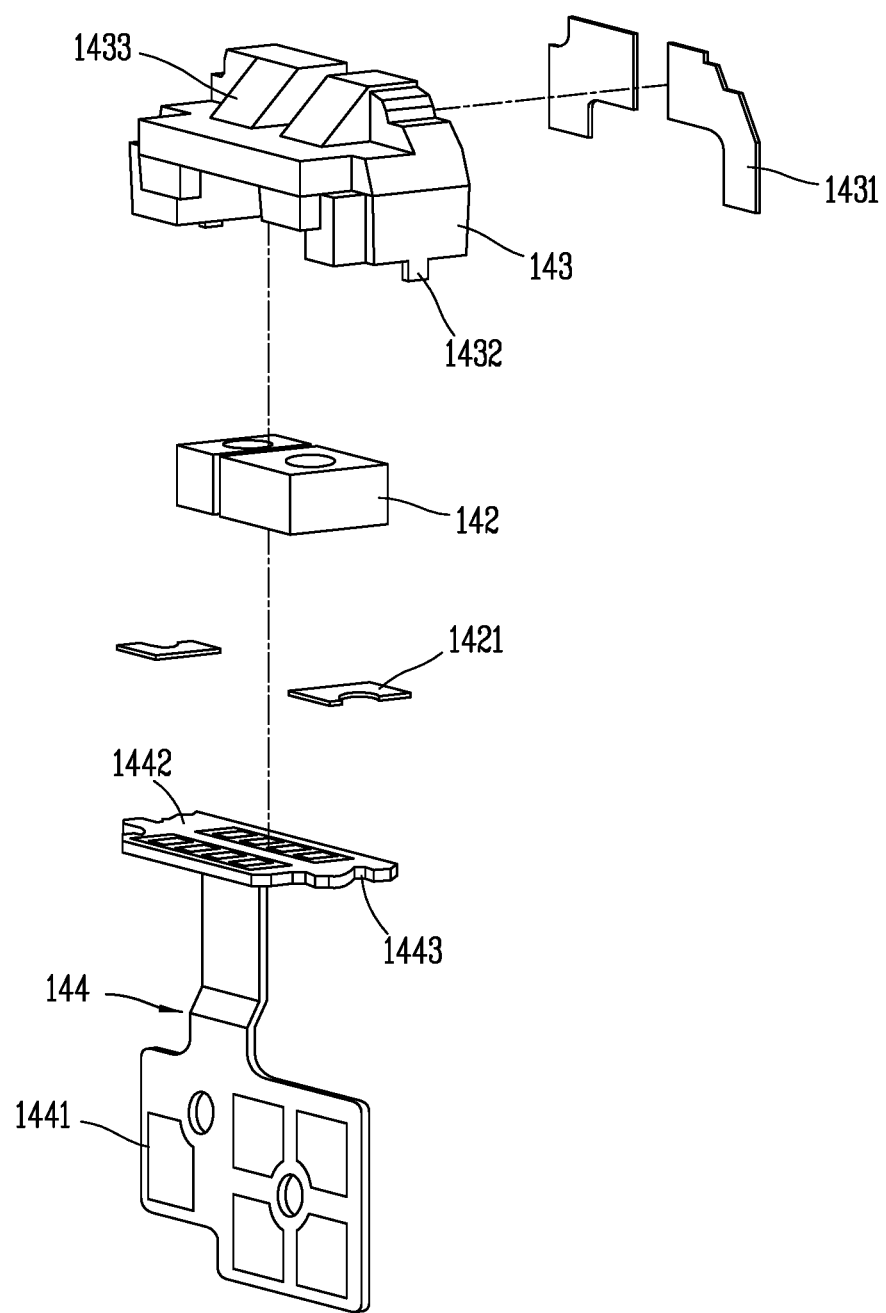

Also, the proximity illuminance sensor 142 is formed adjacent to the receiver 152a, and a flexible printed circuit board 144 is connected to a lower end of the proximity illuminance sensor 142. The light reflector 143 is coupled to an upper end of the proximity illuminance sensor 142. FIGS. 14A and 14B are a disassembled perspective view of a proximity illuminance sensor module 145 and a perspective view after coupling the proximity illuminance sensor module 145 in accordance with one embodiment of the present invention. The light reflector 143, the proximity illuminance sensor 142 and the flexible printed circuit board 144 are modularized into an integral form to facilitate management and coupling.

Referring to FIG. 14B, protrusions 1432 are formed on both sides of a lower end of the light reflector 143 to form an empty space therebetween. The proximity illuminance sensor 142 is inserted into the empty space, and closely fixed to grooves 1443, which are formed on a coupling portion 1442 of the flexible printed circuit board 144, by the protrusions 1432. In this instance, a both-sided tape 1421 is used for coupling the light reflector 143 and the coupling portion 1442 to each other. Also, the reflective surface 1433 is provided at an inner side of the light reflector 143. A high-brightness material may be deposited on a rear surface of the reflective surface 1433 to more improve optical reflection efficiency. For example, the deposition film on the reflective surface 1433 may be thin in thickness to form a non-conductive film (non-conductive vacuum metalizing (NCVM)) with avoiding a contact between conductive materials. By the formation of the deposition film, the reflective surface 1433 cannot be affected by electric waves. A high-brightness spray method may also be used for realizing a feeling like a mirror by use of a paste which is coated after depositing aluminum and liquefying the deposited aluminum. As such, the use of the high brightness spray method may result in higher reflectivity and metallic texture than those of a typical coating method. Also, every task can be completed on a coating line without a separate deposition process, thereby simplifying processes.

Meanwhile, the both-sided tape 1431 may be attached on a front surface of the light reflector 143 to be attached on the front case 101. The flexible printed circuit board 144 may electrically be connected to a printed circuit board 148, which is realized by a contact pad 1441.

Figure 5:
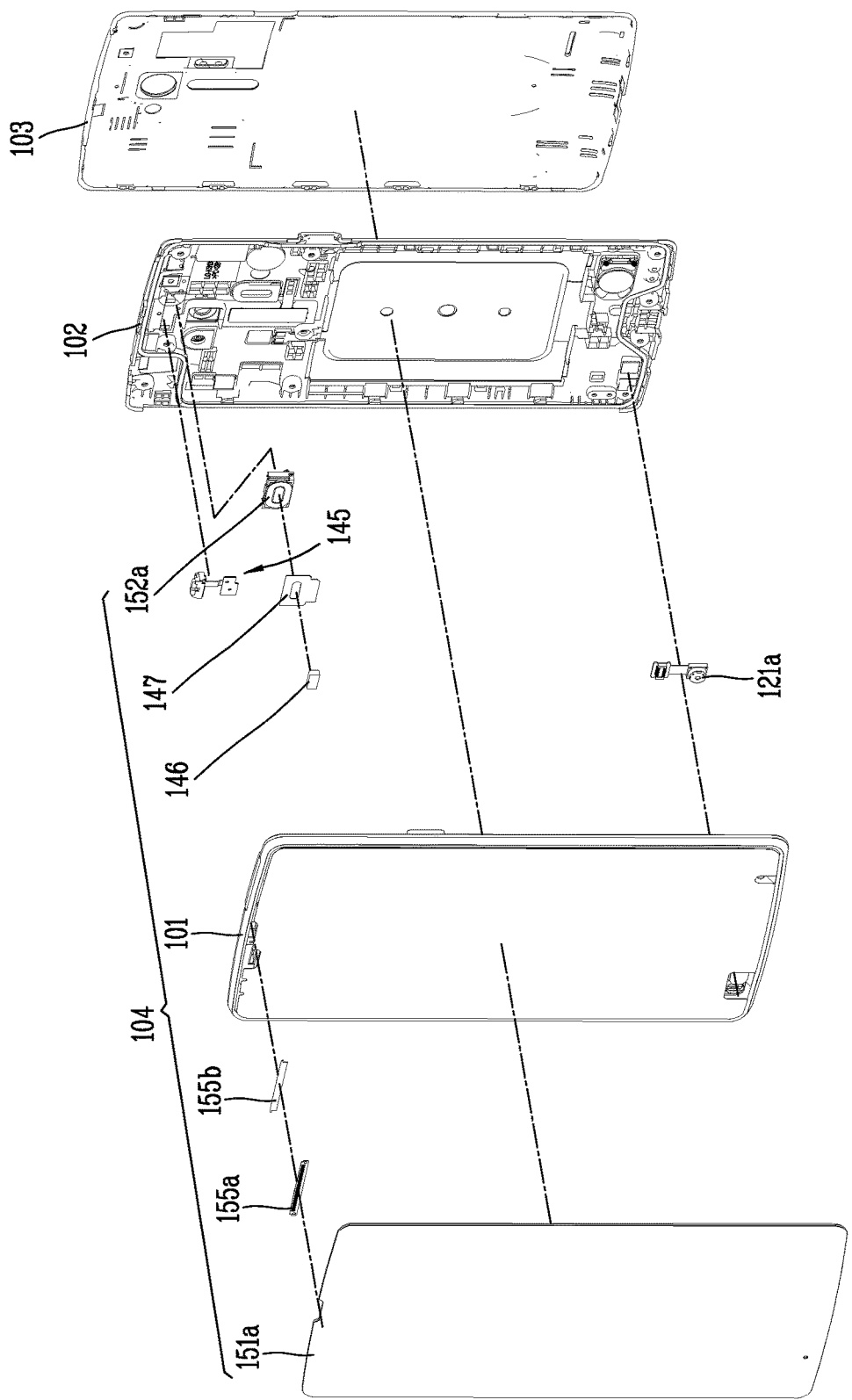
FIG. 5 is a disassembled perspective view of a mobile terminal according to the present invention.

FIG. 5 is a disassembled perspective view of the mobile terminal simultaneously including the components of FIGS. 6 and 7.

According to one embodiment of the present invention, components coupled to the front case 101 may be realized as a module 104. That is, the other components except for the rear case 102 and the rear cover 103 may be modularized.

After assembling those components to the front case 101, the window 151a and the display 151b may be coupled to construct an assembly, followed by covering the rear case 102 and the rear cover 103, thereby fabricating the mobile terminal.

Figure 11:
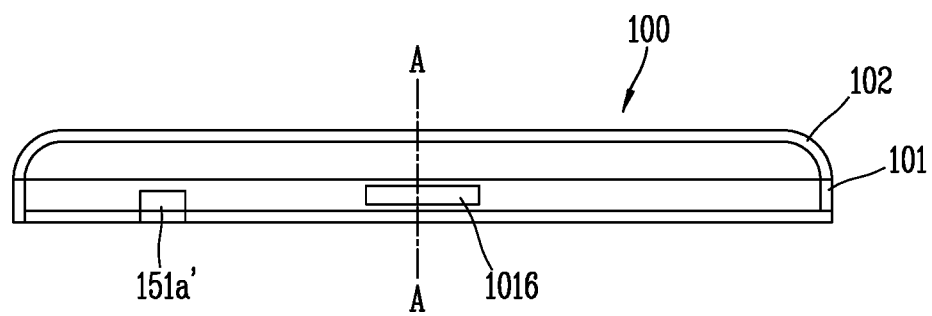
FIG. 11 is a view illustrating a sound passage of a mobile terminal according to the present invention.
Figure 11:
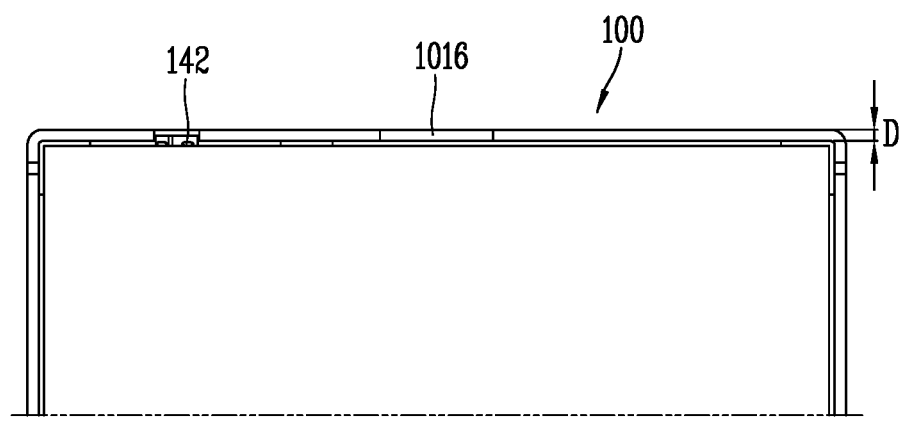
Figure 12A:
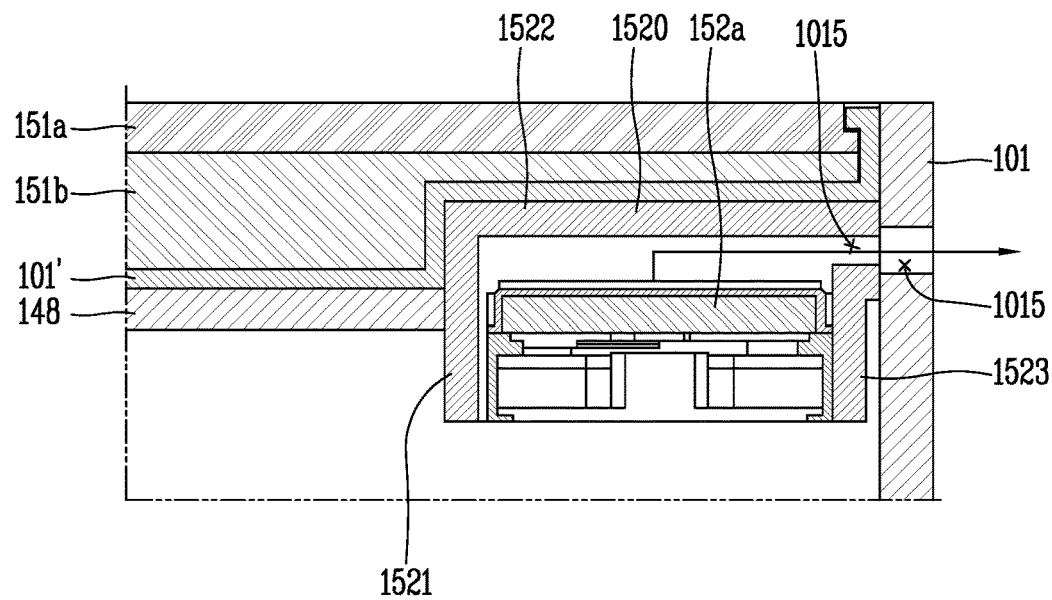
FIGS. 12A to 13B are views illustrating an arrangement of a receiver of a mobile terminal according to the present invention.
Figure 12B:
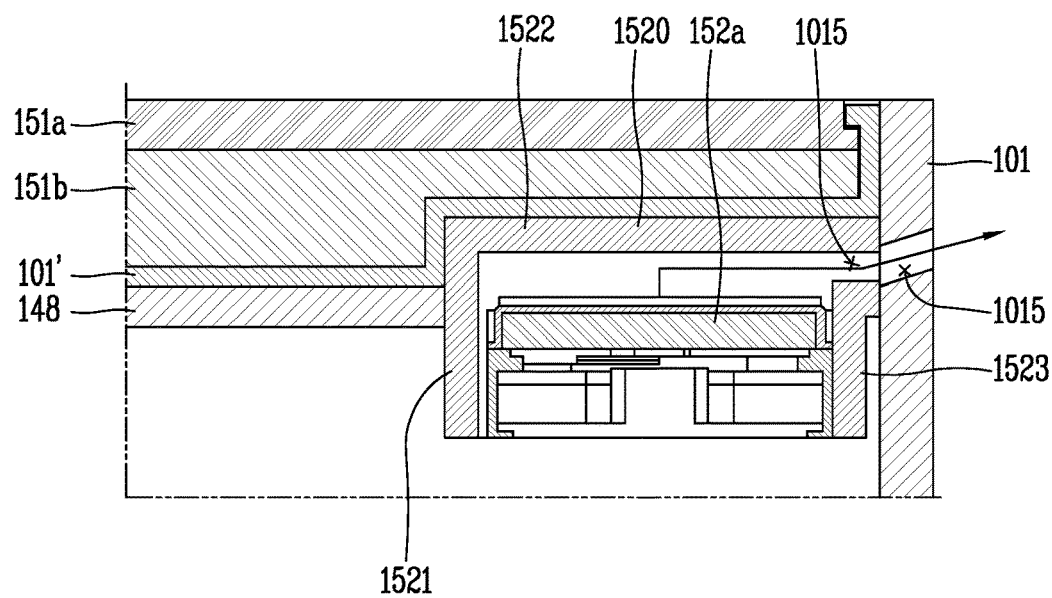

Meanwhile, FIG. 11 is a view of top and upper surfaces of the mobile terminal in accordance with one embodiment of the present invention, and FIGS. 12A and 12B are sectional views taken along the line AA of FIG. 11. According to the one embodiment of the present invention, a location of a receiver hole 1016 may be changed to an upper end portion of the mobile terminal so as to reduce a bezel D with maintaining a design unity. A sound passage 1016 may also be referred to as the receiver hole. In this instance, a sound is transferred to a user through a bracket 1520 and the front case 101. An optimized sound passage 1015, 1016 can be found by adjusting a direction while changing shapes of the bracket 1520 and the front case 101.

That is, the receiver 152a is disposed to face the front case, and a first sound passage 1015 is formed by the bracket 1520. The first sound passage 1015 is connected to a second sound passage 1016 formed through an upper end of the front case 101, such that a sound can be output through an upper surface of the front case 101.

In this instance, the receiver 152a and the bracket 1520 may be disposed at an overlapped area with the display 151b. The bracket 1520 may be formed on portions 1521, 1522 and 1523 which are directly affected by stress when the mobile terminal is dropped, and cover every portion except for the first sound passage 1015. The structure of the front case 101 may change for the arrangement of the bracket 1520. For example, as illustrated in FIGS. 12A and 12B, the second sound passage 1016 may be formed through the upper surface of the front case 101 in a manner that a sound can be output straightly, or the second sound passage 1016 formed through the upper surface of the front case 101 may also be inclined toward the window 151a.

FIGS. 12A and 12B illustrate that a part of a front frame 101' constructing the front case 101 is upwardly recessed to arrange the bracket 1520 and closely adhered on the display 151b, to simultaneously reduce a thickness of the mobile terminal. In this instance, a sound passage formed by the bracket 1520 may be referred to as the first sound passage 1015, and a sound passage formed by the front case 101 may be referred to as the second sound passage 1016. The first sound passage 1015 and the second sound passage 1016 communicate with each other.

Figure 13A:
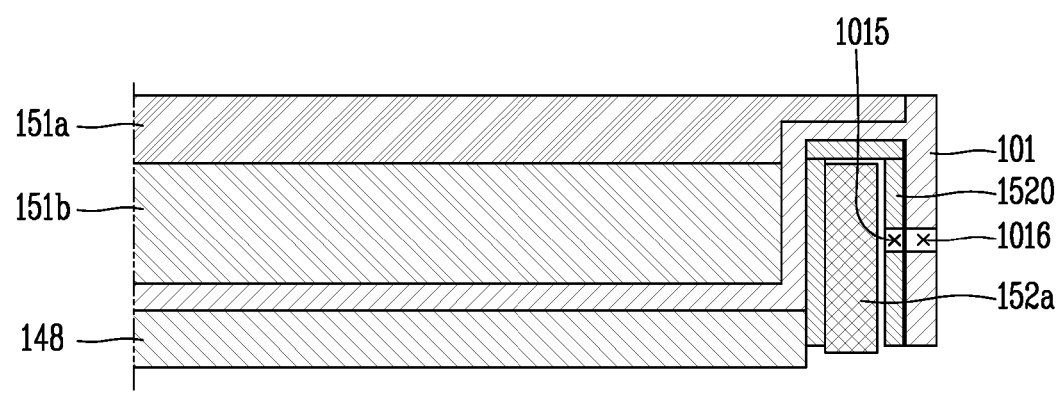
Figure 13B:
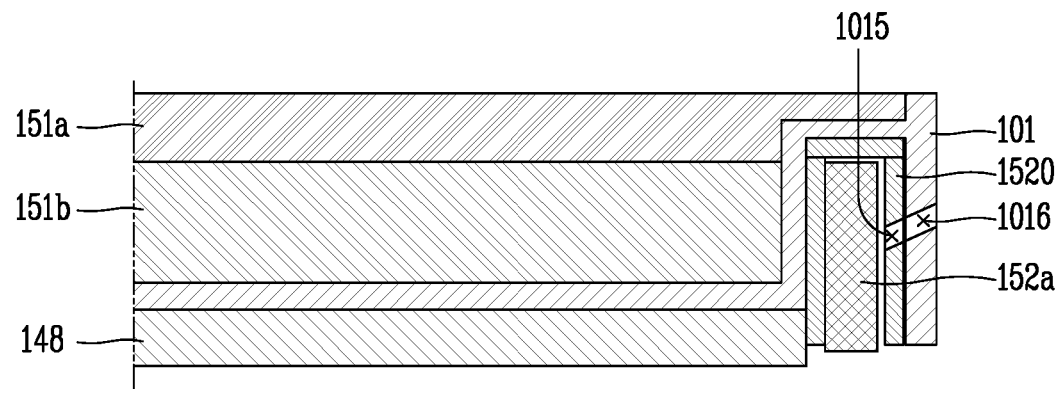

Also, in one embodiment of the present invention, the receiver 152a may be formed perpendicular to the display 151b at a non-overlapped area with the display 151b, and the sound passage may be formed to face the upper surface of the front case 101 using the bracket 1520 and the front case 101. That is, as illustrated in FIGS. 13A and 13B, the window 151a and the display 151b are mounted on the front case 101, and an upper end of the front case 101 protrudes more toward the window 151a to accommodate the receiver 152a and the bracket 1520. Here, the display 151b is not accommodated in the protruded portion. Even in this instance, the first sound passage 1015 may be formed by the bracket 1520 and simultaneously the second sound passage 1016 may also be formed through the front case 101. Also, the first sound passage 1015 and the second sound passage 1016 may be formed to be perpendicular or inclined to the upper surface of the front case 101. Also, the first sound passage 1015 and the second sound passage 1016 communicate with each other.

FIGS. 11 to 13 illustrate that a moving passage of a sound output from the receiver 152a is formed toward the upper surface of the mobile terminal. In one embodiment of the present invention, the proximity illuminance sensor 142 may also be arranged to face the upper surface of the mobile terminal.

Figure 15:
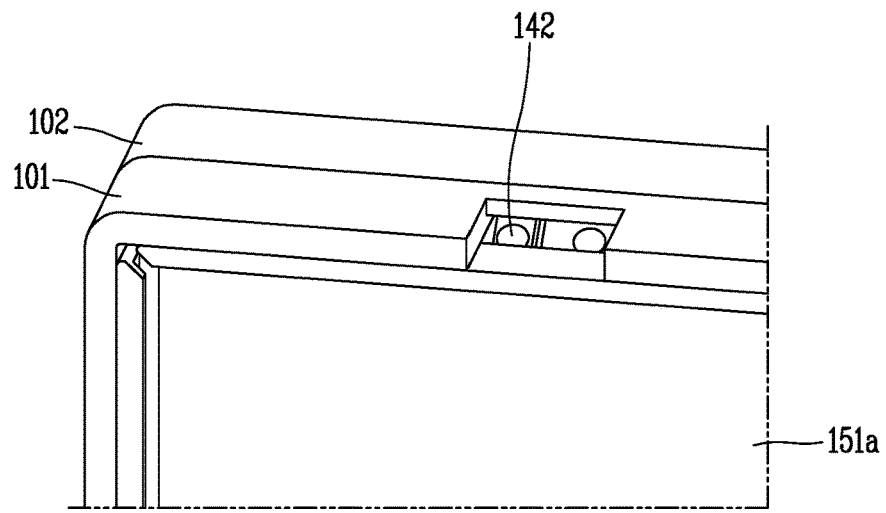
FIG. 15 is a view illustrating an upper bezel of a mobile terminal according to the present invention.
Figure 16:
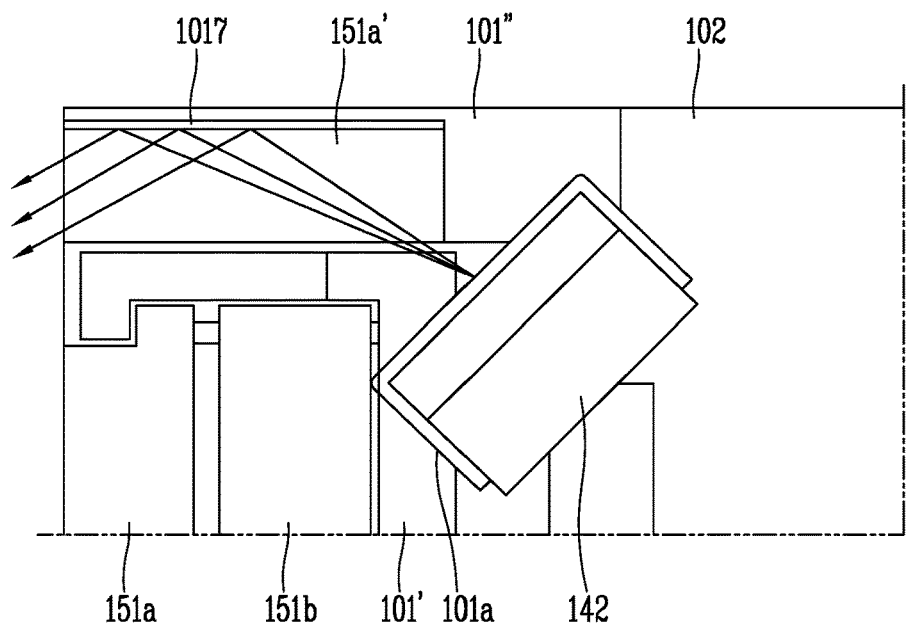
FIG. 16 is an enlarged view of a part of FIG. 15.

FIG. 15 illustrates an upper bezel of the mobile terminal according to the present invention, and FIG. 16 is an enlarged view of a part of FIG. 15. As illustrated in FIGS. 15 and 16, a mobile terminal according to one embodiment of the present invention includes a window 151a, a display 151b disposed on a rear surface of the window 151a, a front case 101 accommodating the window 151a and the display 151b therein, and a proximity illuminance sensor 142 arranged on a rear surface of the front case 101. This configuration of the mobile terminal is the same as that of the previous embodiment. However, a part of an upper end 101" of the front case 101 is cut off, and glass 151a' is arranged in the cut-off portion. Also, a reflective layer 1017 is formed on an inner side surface of the upper end 101" of the front case 101 such that light is received and output to the proximity illuminance sensor 142. The proximity illuminance sensor 142 is formed to be inclined with respect to the reflective layer 1017 such that light can be sensed by the reflective layer 1017.

That is, the proximity illuminance sensor 142 is inclined with respect to the reflective layer 1017, and an upper surface of the front case 101 or the rear case 102 is cut off and the glass 151a' is accommodated in the cut-off portion.

As such, the size of the upper bezel can be reduced by using the reflective layer 1017 that is formed on the inner side surface of the upper end of the front case 101. In the previous embodiment, the reflective surface 1433 of the light reflector 143 is used for light to be incident and reflected to the proximity illuminance sensor 142. However, in FIGS. 15 and 16, the part of the upper end of the front case 101 may be cut off and the glass 151a' may be inserted in the cut-off portion such that light can be incident or reflected from the reflective layer 101 by virtue of the uppermost end of the mobile terminal. To this end, a groove 101a or a rib is formed on the front frame 101' of the front case 101 such that the proximity illuminance sensor 142 can be accommodated therein. Meanwhile, the front frame 101' and the upper end 101" of the front case are connected to each other to form an integral form, and construct the front case 101.

With the configuration, as illustrated in FIG. 11A, it can be noticed that the second sound passage 1016 formed through the front case 101 and the glass 151a' for the sensing of the proximity illuminance sensor 142 are arranged adjacent to each other.

Meanwhile, one embodiment of the present invention, as illustrated in FIGS. 14A and 14B, provides the proximity illuminance sensor module 145 which includes the proximity illuminance sensor 142, the light reflector 143 disposed at one side of the proximity illuminance sensor 142 such that light can be received to the proximity illuminance sensor 142 or externally output from the proximity illuminance sensor 142, a coupling portion 1442 having the proximity illuminance sensor 142 mounted thereon and coupled to the light reflector 143, and the flexible printed circuit board 144 extending the coupling portion 1442 and having a contact pad 1441 formed on one surface thereof.

In this instance, the light reflector 143 is provided with the reflective surface 1433 for reflecting light. The reflective surface 1433 is configured in a manner that a passage of light incident to the proximity illuminance sensor 142 or reflected from the proximity illuminance sensor 142 faces the front of the light reflector 143.

If the mobile terminal is a bar type, the proximity illuminance sensor module 145 may be provided on a side surface or a rear surface of the mobile terminal. On the other hand, if the mobile terminal is a watch type or a glass type, the proximity illuminance sensor module 145 may be provided at one side of the display 151b.

The detailed description should not be limitedly construed and considered as illustrative. The scope of the present invention should be decided by reasonable interpretation of the appended claims and all changes and modifications fall within the metes and bounds of the claims, or equivalents of such metes and bounds are therefore intended to be embraced by the appended claims.

The embodiments of the present invention can be applied to a mobile terminal having a proximity illuminance sensor module or a receiver.

The invention claimed is:

1. A mobile terminal, comprising:
   a window;
   a display disposed on a rear surface of the window;
   a front case having the window and the display mounted thereon and defining a part of appearance;
   a proximity illuminance (Infrared; IR) sensor disposed on a rear surface of the front case to be perpendicular to the display; and
   a light reflector disposed at one side of the proximity illuminance sensor such that light is incident to the proximity illuminance sensor or externally output from the proximity illuminance sensor,
   wherein the light reflector comprises a reflective surface for reflecting light,
   wherein the reflective surface is arranged such that the light is output to a non-overlapped area with the display, and
   wherein the reflective surface forms an inclination angle together with the window and the inclination angle is smaller than or equal to 45°.

2. The terminal of claim 1, wherein the angle formed between the reflective surface and the window is reduced when the light reflector overlaps the display.

3. The terminal of claim 2, further comprising a receiver disposed at one side of the proximity illuminance sensor, formed on the rear surface of the front case, and having an upper end portion located on the same line as or below an upper end portion of the light reflector.

4. The terminal of claim 3, wherein the receiver is arranged to face a front surface and a sound output from the receiver is externally output through a sound passage.

5. The terminal of claim 4, wherein the sound passage is curved at a bent portion.

6. The terminal of claim 5, further comprising a sound leakage preventing pad provided at one side of the sound passage to prevent a sound leakage.

7. The terminal of claim 6, wherein the receiver is inserted into a receiver insertion hole, and
   wherein the terminal further comprises a sound leakage preventing member covering the sound leakage preventing pad and the receiver insertion hole.

8. The terminal of claim 3, wherein the receiver is arranged to face a front surface, a first sound passage is formed by a bracket, and the first sound passage is connected to a second sound passage formed through an upper end of the front case such that a sound is output through an upper surface of the front case.

9. The terminal of claim 8, wherein the second sound passage is inclined toward the front surface.

10. The terminal of claim 8, wherein a part of the front case includes a cut-off portion, and the bracket is accommodated in the cut-off portion.

11. The terminal of claim 3, wherein the receiver is perpendicularly formed at the non-overlapped area with the display, a first sound passage is formed by a bracket, and the first sound passage is connected to a second sound passage formed through an upper end of the front case such that a sound is output through an upper surface of the front case.

12. The tell final of claim 11, wherein the second sound passage is inclined toward a front surface.

13. The terminal of claim 1, wherein the proximity illuminance sensor is electrically connected to a flexible printed circuit board, and the flexible printed circuit board is electrically connected to a main printed circuit board.

14. The terminal of claim 1, wherein a high-brightness material is disposed on a rear surface of the light reflector.

15. The terminal of claim 1, wherein a front camera is disposed on a lower end of the front case.

16. The terminal of claim 15, wherein the front camera is disposed in a camera hole formed on the front case, and a movement-preventing rib protrudes around the camera hole.

* * * * *